US012320996B2

(12) United States Patent
Norris et al.

(10) Patent No.: US 12,320,996 B2
(45) Date of Patent: Jun. 3, 2025

(54) DIFFRACTIVE OPTICAL ELEMENT

(71) Applicants: ETH Zurich, Zurich (CH); Universiteit Utrecht Holding B.V., Utrecht (NL)

(72) Inventors: David J. Norris, Zürich (CH); Nolan Lassaline, Zürich (CH); Raphael Brechbühler, Aarau (CH); Freddy Rabouw, Utrecht (NL)

(73) Assignees: ETH Zurich, Zurich (CH); Universiteit Utrecht Holding B.V., Utrecht (NL)

( * ) Notice: Subject to any disclaimer, the term of this patent is extended or adjusted under 35 U.S.C. 154(b) by 606 days.

(21) Appl. No.: 17/628,940

(22) PCT Filed: Jul. 7, 2020

(86) PCT No.: PCT/EP2020/069092
§ 371 (c)(1),
(2) Date: Jan. 21, 2022

(87) PCT Pub. No.: WO2021/013533
PCT Pub. Date: Jan. 28, 2021

(65) Prior Publication Data
US 2022/0260763 A1    Aug. 18, 2022

(30) Foreign Application Priority Data

Jul. 23, 2019  (EP) .................... 19187802

(51) Int. Cl.
*G03F 7/00* (2006.01)
*G02B 5/18* (2006.01)

(52) U.S. Cl.
CPC ......... *G02B 5/1852* (2013.01); *G02B 5/1819* (2013.01); *G02B 5/1857* (2013.01); *G03F 7/0005* (2013.01)

(58) Field of Classification Search
CPC .. G02B 5/1852; G02B 5/1819; G02B 5/1857; G02B 6/34; G02B 27/4272; G03F 7/0005; B82Y 20/00; B82Y 40/00
See application file for complete search history.

(56) References Cited

U.S. PATENT DOCUMENTS 4,560,249  A      12/1985  Nishiwaki et al.
9,817,164  B2 *   11/2017  Murakowski ........ G02B 5/1857
(Continued)

FOREIGN PATENT DOCUMENTS

CN         106842397 A      6/2017
KR    10-2004-0103285 A    12/2004
(Continued)

OTHER PUBLICATIONS

Hiroshi Mukawa, et al. "A full-color eyewear display using planar waveguides with reflection volume holograms", Journal of the society for information display Mar. 17, 2009, pp. 185-193.
(Continued)

*Primary Examiner* — Balram T Parbadia
*Assistant Examiner* — John Curtis Sipes
(74) *Attorney, Agent, or Firm* — Sughrue Mion, PLLC

(57) ABSTRACT

A method of producing a diffractive optical element (1) comprises the steps of providing at least one substrate (3) having a surface (4) and generating a relief structure (2) in the surface (4) of the substrate (3) using a processing device (5). The relief structure (2) is generated such that a distance (D) between a surface (8) of the relief structure (2) and the surface (4) of the substrate (3) along the third direction (z) varies essentially continuously. A diffractive optical element (1) comprises a relief structure (2), wherein at least in a portion of the relief structure (2) a distance (D) between the surface (8) of the relief structure (2) and the surface (4) of the substrate (3) varies essentially continuously. A virtual (Continued)

image display device comprises at least a first and a second of such diffractive optical elements (1).

21 Claims, 15 Drawing Sheets

(56) References Cited

U.S. PATENT DOCUMENTS

| | | | |
|---|---|---|---|
| 2004/0081388 A1* | 4/2004 | Koyama | G02B 6/1225 385/16 |
| 2004/0240232 A1 | 12/2004 | Choi et al. | |
| 2008/0213524 A1* | 9/2008 | Yao | B82Y 20/00 428/38 |
| 2011/0181956 A1* | 7/2011 | Iizuka | G02B 5/1866 359/573 |
| 2014/0165236 A1* | 6/2014 | Budach | G01Q 30/02 850/9 |
| 2016/0265125 A1* | 9/2016 | Yokoyama | C25D 5/48 |
| 2017/0003602 A1 | 1/2017 | Duerig et al. | |
| 2019/0361356 A1* | 11/2019 | Sadeghian Marnani | G01Q 80/00 |
| 2020/0132446 A1* | 4/2020 | Shalibo | G01N 21/9501 |
| 2020/0223206 A1* | 7/2020 | Najiminaini | B81C 1/00634 |
| 2021/0064221 A1* | 3/2021 | Meen | G06F 3/04842 |
| 2021/0215877 A1* | 7/2021 | Kuramochi | G02B 6/1226 |

FOREIGN PATENT DOCUMENTS

| | | |
|---|---|---|
| KR | 10-0938656 B1 | 1/2010 |
| KR | 10-2018-0130580 A | 12/2018 |
| WO | 2017/182771 A1 | 10/2017 |

OTHER PUBLICATIONS

Kulmala T., et al., "Single-nanometer accurate 3D nanoimprint lithography with master templates fabricated by NanoFrazor lithography", Proceedings of SPIE, 2018, 9 pages.

Anonymous, "SwissLitho NanoFrazor Scholar & Explore Specification Data Sheet", Retrieved from the Internet: URL:https://www.qdusa.com/siteDocs/productBrochures/SwissLitho_NanoFrazor_Product_Comparison.pdf [retrieved on Jan. 15, 2020], 2017, 2 pages.

Cheng-Chung Lee, "The Current Trends of Optics and Photonics", Plasmonic Nanoslit Arrays for Sensitive Biosensors, 2014, pp. 458-459.

International Search Report of PCT/EP2020/069092 dated Oct. 19, 2020 [PCT/ISA/210].

Written Opinion of PCT/EP2020/069092 dated Oct. 19, 2020 [PCT/ISA/237].

Zhiqin Huang et al., "Out-of-plane computer-generated multicolor waveguide holography", Optica, 2019, vol. 6, No. 2, pp. 119-124 (6 pages total).

Swisslitho AG, QuantumDesignr Division, "Introduction to Thermal Scanning Probe Technology NanoFrazor.PDF", Thermal Pattern Detector, retrieved from internet: [[ https://max.book118.com/html//2017/1003/135609207.shtm ]] , 2017, 4 pages total.

* cited by examiner

DIFFRACTIVE OPTICAL ELEMENT

CROSS REFERENCE TO RELATED APPLICATIONS

This application is a National Stage of International Application No. PCT/EP2020/069092 filed on Jul. 7, 2020, claiming priority based on European Patent Application Ser. No. 19/187,802.4 filed on Jul. 23, 2019.

TECHNICAL FIELD

The present invention relates to a method for producing a diffractive optical element according to claim 1, to a diffractive optical element produced by such a method according to claim 11, and to a diffractive optical element according to claim 12. Moreover, the present invention relates to a virtual image display device comprising such diffractive optical elements according to claims 15 and 16.

PRIOR ART

Diffractive optical elements are well known in the art and are commonly used for shaping and sorting beams of electromagnetic radiation. As such, they find various applications such as in optics and spectroscopy. The underlying physical principle is diffraction, wherein beams of electromagnetic radiation that are incident on the diffractive optical element under a particular incoming angle are diffracted from the diffractive optical element under a particular outgoing angle. Diffractive optical elements are based on periodic or aperiodic structures, wherein the Fourier spectrum of the refractive index modulation along these structures controls how incident electromagnetic radiation is diffracted. Relief structures that are generated in a surface of the diffractive optical element are primarily used for this purpose in technological applications. From U.S. Pat. No. 4,895,790 the generation of multilevel diffractive optical elements is known, wherein a plurality of binary masks are used in serial etching of a multilevel structure into the optical element. However, the limitations in the fabrication of such structures prevent control over their Fourier spectrum, which in turn limits the function of the diffractive optical elements. For example, the limited control over the Fourier spectrum of diffractive optical elements prevents the miniaturization of diffractive optical systems and also places a limit on the quality of diffracted images, such as computer-generated holograms. In order to achieve a multi-color in-coupling of light to an integrated holographic system, Huang, Zhiqin, Daniel L. Marks and David R. Smith. "*Out-of-plane computer-generated multicolor waveguide holography*", Optica 6.2 (2019): 119-124 proposes to in-couple three different laser colors at three highly specific angles. Such in-coupling systems are large and complex and are not practical for compact, wearable devices as they are desired in the field of virtual reality systems, for example. Similar disadvantages can also be observed in the solution proposed in Mukawa, Hiroshi, et al. "*A full-color eyewear display using planar waveguides with reflection volume holograms*", Journal of the society for information display 17.3 (2009): 185-193, wherein one diffractive optical element is used for each color of light to be in-coupled.

SUMMARY OF THE INVENTION

It is an object of the present invention to overcome the disadvantages of the prior art. In particular, it is an object to provide a method that enables a simple yet high quality production of a diffractive optical element that diffracts one or more beams of electromagnetic radiation in the desired manner. More particularly, it is an object to provide a method that enables the production of a diffractive optical element that allows a full control over its Fourier spectrum by including only the desired Fourier components and omitting all other unwanted Fourier components.

In particular, the method of In particular, the method of producing a diffractive optical element comprises the steps of i) providing at least one substrate having a surface extending in a first direction and a second direction running perpendicularly to the first direction, and ii) generating a relief structure in the surface of the substrate using a processing device. The processing device comprises a probe having a tip. The tip has a radius that is smaller than about 1 micrometer, preferably smaller than about 20 nanometer. The probe is movable in the first direction, the second direction and a third direction running perpendicularly to the first direction and the second direction with respect to the substrate, and wherein the relief structure is generated by an action of the tip on the surface of the substrate such that a distance between a surface of the relief structure and the surface of the substrate along the third direction varies essentially continuously along at least one of the first direction and the second direction.

In the context of the present invention, the expressions "varies continuously" should be understood in its mathematical sense. That is, the continuous variation of the distance between the surface of the relief structure and the surface of the substrate along at least one of the first direction and the second direction can be understood in the sense that the derivative is continuous, and bounded and defined anywhere in the respective at least one of the first direction and the second direction. In other words, the relief structure has a shape which does not comprise any steps or edges or jumps. Or, figuratively speaking, the surface of the relief structure is smooth. The expression "essentially" shall indicate here that the relief structure is continuous in so far as it is permitted by the processing device, in particular by its tip having a radius that is smaller than about 1 micrometer, preferably smaller than about 20 nanometer (see also further below).

Hence, the method according to the invention enables the production of a diffractive optical element having a continuous relief structure. This allows the Fourier spectrum of a single diffractive optical element to be controlled. In other words, the diffractive optical element generated by the method according to the invention contains all information necessary in the Fourier spectrum for the interaction with one but especially also with multiple colours of light. Again in other words, the present method enables the production of a diffractive optical element having a grayscale relief structure. This prevents the need to couple different colours at different incoming angles or to have a diffractive optical element for each colour as it is the case in the systems of the state of the art. The present method thus allows for the simplification and miniaturization of diffractive optics technology, especially also in holographic applications requiring multicolor functionality. At the same time, higher quality holograms can be produced.

To this end it should be noted that the relief structure can consist entirely of a continuous shape as just described. However, it is likewise conceivable that the relief structure can comprise a continuous shape as just described but also one or more portions which are of a different shape, for example of a binary shape. Hence, the processing device enables the generation of a relief structure according to the particular needs of the end use of the diffractive optical element.

The relief structure is preferably generated by a mechanical and/or thermal action of the tip on the surface of the substrate. The tip can be in direct contact with the surface of the substrate upon the generation of the relief structure. That is, the tip of the probe can immediately act onto the surface of the substrate and for example remove parts of the substrate it acts upon. A mechanical action can be a physical removal of material from the surface of the substrate, i.e. a subtractive technique where material is selectively removed from the surface of the substrate. A thermal action can be applied by means of a heated tip, for example, where material from the surface of the substrate is selectively thermally decomposed and/or removed. A heating of the tip can be achieved by applying an electrical current to the probe and thus the tip. It is of course possible that these actions are combined and that a heated tip is used to mechanically remove material from the substrate. In any case, a removal of material from the surface in the third direction is achieved by moving or pushing the heated probe and thus the tip along the third direction into the surface of the substrate. By varying the strength of the force that is applied by the probe to the surface along the z direction, the depth of the relief structure with respect to the third direction is controlled. The processing device preferably corresponds to a thermal scanning-probe lithography device as it is known in the art. Hence, it is particularly preferred to use a commercially available thermal scanning-probe lithography device as it is sold by the company SwissLitho AG. The usage of such a processing device, in particular because of its spatial resolution, enables the generation of a relief structure being continuous on a larger length scale in the first direction and/or in the second direction as compared to a continuous relief structure being obtained from a common etching process. A further advantage that is associated with such a device lies in the capability of the probe to read out and analyze the relief structure that is generated upon its generation. That is, the tip can be used to scan over the surface of the sample while it writes/creates/patterns the relief structure into the surface of the sample and at the same time also reads or images the relief structure. This generates a closed-loop feedback system that results in an accurate and precise profile of the surface relief structure.

The probe can be moved in the first direction and/or in the second direction in steps of about 0.1 nanometer to 50 micrometer, in particular in steps of about 0.1 nanometer to 100 nanometer, preferably in steps of 5 nanometer to 50 nanometer, particularly preferably in steps of less than about 20 nanometer. Additionally or in the alternative the probe can be moved in the third direction in steps of about 0.1 nanometer to 1 micrometer, preferably in steps of 0.2 nanometer to 25 nanometer, particularly preferably in steps of less than about 2 nanometer.

By moving the probe, and thus the tip, along at least one of the first direction and the second direction in the just-mentioned steps, it is possible to generate a relief structure having a plurality of elevations and recesses extending along the first direction and/or the second direction. Moreover, by using a probe having a tip as described initially it is possible to generate a relief structure wherein a minimal horizontal distance between two successive elevations or recesses when seen along the first direction and the second direction, respectively, is smaller than about 20 nanometer. In particular, the minimal horizontal distance is about 10 nanometer. Moreover, it is likewise possible to generate a relief structure having a minimal depth that is smaller than about 10 nanometer. In particular, the minimal depth is about 0.2 nanometer. Said depth extends in the third direction running perpendicularly to the first direction and the second direction of the surface, and thus of the substrate, and is formed between two successive elevations or recesses when seen along the first direction and the second direction, respectively.

The probe, and thus the tip, can be moved in the first direction and/or the second direction with a rate of between about 1 hertz to 1,000 kilohertz, preferably between about 1 kilohertz to 500 kilohertz. At the same time it is conceivable that the tip acts on the surface of the substrate. In other words, it is conceivable that the probe is configured to pattern the relief structure at a rate of between about 1 hertz to 1000 kilohertz, preferably between about 1 kilohertz to 500 kilohertz. It is likewise conceivable that the probe is configured to simultaneously read the written pattern, i.e. to read the relief structure at the given rate. Additionally or alternatively the tip can be heated to a temperature in the range of about 100° C. to 1,500° C., preferably in the range of about 700° C. to 1,400° C. These parameters are set in accordance with the dimensions of the relief structure that shall be generated and adapted to the material of the substrate, respectively.

The processing device can further comprise a controller configured to control the probe based on controller data that is fed into the controller, wherein the controller data defines the relief structure along a horizontal plane being spanned by the first direction and the second direction and is based on one or more functions. The one or more functions preferably correspond to one or more continuous functions. The controller data is particularly preferably based on one or more sinusoidal functions. Other examples of conceivable functions used to control the movements of the probe are Bessel functions or Gaussian functions. Hence, it is conceivable to base the controller data on one or more continuous and smooth functions. In this way the probe, and thus the tip, perform a continuous and possibly also smooth movement. The spatial profile that defines said continuous and possibly also smooth movement is then transferred into the surface of the substrate upon the action of the tip onto the surface of the substrate.

The one or more sinusoidal functions can be represented by the expression:

$$f_n(x, y) = A_n \sin(k_n(x \cos \alpha_n - y \sin \alpha_n) + \varphi_n) + \Delta_n$$

wherein the parameter $A_n$ is the amplitude,
wherein the parameter $k_n$ is the spatial frequency,
wherein the parameter $\alpha_n$ is the angular direction along the horizontal plane,
wherein the parameter $\varphi_n$ is the phase, and
wherein the parameter $\Delta_n$ is an offset with respect to the third direction.

Depending on the end application of the diffractive optical element it is conceivable to base the controller data on adequate and predetermined values of at least one of the amplitude $A_n$, the spatial frequency $k_n$, the angular direction an, the phase $\varphi_n$, and the offset $\Delta_n$.

In particular, the amplitude $A_n$ corresponds to the amplitude along the third direction. The amplitude of the relief structure relates to the strength or efficiency of the diffraction of incident electromagnetic radiation. For example, if electromagnetic radiation shall be diffracted at high intensity the amplitude should be increased, and vice versa.

The spatial frequency is given by $$k_n = |\vec{k}_n| \text{ where } \vec{k}_n = \frac{2\pi}{\Lambda}\hat{k}_n,$$

with $\Lambda$ being the wavelength of the relief structure extending in the angular direction $\alpha_n$ along the horizontal plane. The spatial frequency of the relief structure is preferably chosen such, that the in-plane wavevector of electromagnetic radiation being incident on the relief structure is matched to the in-plane wavevector of the output mode, which is given by the momentum-matching equation:

$$|\vec{k}_{\|,out}| = |\vec{k}_{\|,in} \pm \vec{k}_n|, \text{ where } \vec{k}_{\|,in} = |\vec{k}_{0,in}|\sin\theta_{in}\hat{k}_{\|,in},$$

$$\vec{k}_{0,in} = \frac{2\pi}{\lambda_0}n_{in}\hat{k}_{0,in}, \text{ and } \vec{k}_{\|,out} = |\vec{k}_{0,out}|\sin\theta_{out}\hat{k}_{\|,out}, \vec{k}_{0,out} = \frac{2\pi}{\lambda_0}n_{out}\hat{k}_{0,out}.$$

$\vec{k}_{\|,in}$ is the in-plane wavevector of the incident electromagnetic radiation.

$\vec{k}_{\|,out}$ is the in-plane wavevector of the diffracted outgoing electromagnetic radiation.

$\hat{k}_{0,in}$ is the unit vector along the direction of propagation of the incident electromagnetic radiation.

$\hat{k}_{0,out}$ is the unit vector along the direction of propagation of the diffracted outgoing electromagnetic radiation.

$\hat{k}_{\|,out}$ is the unit vector along the direction of propagation of the diffracted outgoing electromagnetic radiation in-plane.

$\hat{k}_{\|,in}$ is the unit vector along the direction of propagation of the incident electromagnetic radiation in-plane.

$\vec{k}_n$ is the wavevector of the relief structure, given by $$\vec{k}_n = \frac{2\pi}{\Lambda}\hat{k}_n.$$

$\Lambda$ is the wavelength of the relief structure defining the diffractive optical element.

$\hat{k}_n$ is the unit vector along the direction of the relief structure, which is here along the surface of the substrate.

$\theta$ is the angle of the incident electromagnetic radiation (herein also called $\theta_{in}$) and of the diffracted outgoing electromagnetic radiation (herein also called $\theta_{out}$) with respect to a direction being normal to the surface of the substrate, here with respect to the third direction.

$n_{in}$ is the refractive index of the medium through which the incident electromagnetic radiation propagates.

$n_{out}$ is the refractive index of the medium through which the diffracted outgoing electromagnetic radiation propagates.

$\lambda_0$ is the vacuum wavelength of the electromagnetic radiation.

As mentioned, the above-parameters are preferably chosen in accordance with the end application of the diffractive optical element. As such, the wavelength of the electromagnetic radiation that shall be irradiated and diffracted by the diffractive optical element as well as the refractive index of the substrate are known. The angle of the incident electromagnetic radiation and the angle of the diffracted outgoing electromagnetic radiation are set in accordance with the end application, as well. For example, if the diffractive optical element shall be used in a virtual image display device, the angle of the incident electromagnetic radiation is preferably set to normal incidence with respect to the direction being normal to the surface of the substrate, i.e. 0°, and the angle of the diffracted outgoing electromagnetic radiation is preferably selected to be 90° with respect to the direction being normal to the surface of the substrate such that the diffracted outgoing electromagnetic radiation travels parallel to a surface plane of the substrate.

The phase $\varphi_n$ is preferably selected such that the relief structure diffracts incoming beams of electromagnetic radiation in a symmetric or in an asymmetric manner. That is, the phase determines the symmetry of the relief structure and therefore the symmetry of the optical diffraction, i.e. the diffraction of the electromagnetic radiation at the relief structure. If the phase is chosen such that the relief structure is symmetric then the diffractive optical element diffracts equal amounts of incident electromagnetic radiation to positive and negative angles relative to a direction being normal to the surface of the substrate along the direction of surface modulation, i.e. along the first direction or the second direction of the diffractive optical element. If the phase is chosen such that the relief structure is asymmetric then the diffractive optical element diffracts unequal amounts of incident electromagnetic radiation to the left side and the right side of the diffractive optical element. The latter enables a so-called routing of the diffracted electromagnetic radiation into a particular angular direction. A (a)symmetric relief structure should be understood here as being (a)symmetric along the first direction or the second direction with respect to a mirror plane running along the third direction through the surface of the relief structure. That is, the phase can be chosen such that the relief structure is symmetric along the first direction (second direction) with respect to a mirror plane running along a plane being spanned by the second direction (first direction) and the third direction.

For example, the surface profile of the relief structure, i.e. the surface of the relief structure in the horizontal plane being spanned by the first direction and the second direction, can be defined as a two-component sinusoid, given by the expression $f(x)=A_1 \sin(k_1x)+A_2 \sin(k_2x+\varphi_{rel})+\Delta$ where $A_1=2*A_2$, $k_2=2*k_1$, the offset $\Delta$ is chosen arbitrarily, and the relative phase parameter $\varphi_{rel}$ determines the mirror symmetry of the function along the x axis about a given point. If the relative phase is chosen such that $\varphi_{rel}=\pi/2$, then the resulting two-component sinusoidal function is mirror symmetric along the x-axis about a given point. If the relative phase is chosen such that $\varphi_{rel}=0$, then the resulting two-component sinusoidal function is not mirror symmetric along the x-axis. These symmetric and asymmetric surface relief profiles will diffract incident electromagnetic radiation with equal and unequal intensity, respectively, into positive and negative angles of outgoing diffracted light. The symmetric case would be desirable for applications which require equal intensities of diffracted light for both positive and negative angles of outgoing diffracted radiation. The asymmetric case would be desirable for applications where one would like to "route" the diffracted electromagnetic radiation into a particular diffracted order, such as in a blazed grating.

Said two or more sinusoidal functions $f_n(x,y)$ are preferably summed up in a Fourier Series:

$$F(x, y) = \sum_n f_n(x, y).$$

For example, if the diffractive optical element shall be used to diffract electromagnetic radiation constituting the colors red at 650 nanometer, green at 550 nanometer and blue at 475 nanometer, then in a first step a sinusoidal function $f_n=(x,y)$ as outlined above is calculated for each of these three colors, i.e. n=3. In a second step, these three sinusoidal functions are summed up in a Fourier Series as it is known in the art.

The controller data is preferably generated by the steps of:
(i) defining the relief structure to be generated in the horizontal plane with one or more preferably sinusoidal functions $f_n(x,y)$ in a computing device, whereby a model relief structure is obtained; and
(ii) discretizing the model relief structure of step (i) into pixels in the computing device, whereby discretized controller data is obtained, the discretized controller data preferably being stored in a digital file, particularly preferably in a bitmap file.

The computing device can correspond to a commercially available computing device as it is known in the art, for example a computer comprising the software tool MAT-LAB®. It should be noted that any other software tool capable of calculating and further processing the one or more functions mentioned above can be used, as well. In this way, the parameters defined above are input into the computing device, for example into the software tool MAT-LAB®, which then calculates the model relief structure. That is to say, the model relief structure is preferably calculated by using a predetermined value of the amplitude $A_n$ and/or a predetermined value of the spatial frequency $k_n$ and/or a predetermined value of the angular direction $\alpha_n$ and/or a predetermined value of the phase $\varphi_n$ and/or a predetermined value of the offset $\Delta_n$. Using the computing device, the model relief structure is subsequently preferably discretized into pixels, and said pixelated data is then stored in a digital file such as a bitmap file. The digital file comprises the controller data that is fed into the controller that controls the movements of the probe.

The pixels preferably have a length in the first direction and/or in the second direction of about 1 nanometer to 1 micrometer, preferably of about 10 nanometer. Moreover, it is preferred if the pixels are provided in the form of squared or rectangular pixels. Additionally or in the alternative it is preferred to discretize the pixels along the third direction to depth levels having a depth level number of at least $2^{\wedge}(m)$ in step (ii) mentioned above, wherein m is at least 3, preferably at least 5, particularly preferably at least 8. That is to say, the controller data preferably comprises a pixelated model relief structure which is discretized along the third direction into depth levels having a depth level number of at least 8, preferably of at least 32, particularly preferably of at least 256. The controller is preferably configured to assign the depth levels to a real depth, wherein the real depth corresponds to a depth of the desired relief structure along the third direction. For example, if the desired relief structure has a depth of 50 nanometers and if the controller data comprises a model relief structure having 256 depth levels along the third direction, the controller could be configured to act on the substrate along the third direction in steps of about 0.2 nanometer, i.e. 50 nanometers divided by 256. When generating the relief structure along at least one of the first and the second direction the force applied to the tip is preferably varied according to the depth level stored in the digital file. In the case of the controller data being based on continuous and possibly also smooth one or more functions, the digital file can be said to correspond to a gray-level digital file, where the force of the tip is applied according to the gray-level of the file. In the preferred case of a bitmap-file, the bitmap can be converted into the relief structure in the substrate, where the depth at one particular position in the first, second and third direction corresponds to a particular grey-level of the bitmap.

The substrate preferably comprises or consists of a thermally sensitive material, preferably a polymer, particularly preferably to poly(methyl methacrylate-co-methacrylic acid), polyphthalaldehyde (PPA), or CSAR. CSAR corresponds to a copolymer on the basis of methyl styrene-co-α-chloromethacrylate with the addition of a halogenated acid generator as it is commercially available. Hence, the substrate can comprise one or more polymers that are responsive to heat. In this case the heatable tip of the probe can be arranged on the surface of the substrate and can locally decompose and/or remove the substrate at locations where it comes into contact with the hot tip. However, a local removal of material of the substrate is likewise conceivable by mechanical action of the tip only or by a combination of heating and mechanical action of the tip.

The generation of the relief structure by means of the processing device can be done according to ways that are commonly known in the art. For example, it is conceivable to generate the relief structure in the surface of the substrate, whereby the diffractive optical element is obtained. Hence, the diffractive optical element can be produced according to a maskless, direct-write technique. However, depending on the end application of the diffractive optical element, it is likewise conceivable to use the substrate comprising the relief structure as a resist pattern which is transferred into other materials by means of e.g. lift-off, etching, plating, molding, etc.

Hence, in one aspect, it is conceivable to apply at least one of a dielectric film or a metal film or a transition metal film such as a silver film on the relief structure, whereby the relief structure is generated in the dielectric film or the metal film or the transition metal film. In a further step, a curable resin such as a UV-curable epoxy resin can be deposited on the dielectric film or the metal film or the transition metal film. Again in a further step, a carrier can be applied to the curable resin, the carrier preferably comprising a dielectric material such as glass, a metal, a transition metal, a semiconductor material such as silicon, a polymerizable polymer, or a polymer. In other words, the relief structure generated in the surface of the substrate is transferred into the dielectric film or the metal film or the transition metal film. Then, the curable resin can be cured. In a next step, a template stripping can be performed such that the carrier, the cured resin and the dielectric film or the metal film or the transition metal film comprising a negative of the relief structure are removed from the substrate. The thus produced template strip corresponds to a diffractive optical element with a profile that is a negative of the surface relief structure defining the template.

In another aspect, it is conceivable that the method further comprises the step of providing a further substrate, wherein the further substrate has a surface and extends along the first direction, the second direction, and the third direction. The substrate can be provided on the surface of the further substrate, and the relief structure of the substrate can be etched into the surface of the further substrate. In doing so, the relief structure of the substrate is transferred into the surface of the further substrate. Thereby, a diffractive optical element consisting of the further substrate having a surface with a relief structure is produced.

It should be noted here that at least one of a dielectric film or a metal film or a transition metal film such as a silver film could likewise be applied to the relief structure generated in the surface of the further substrate, wherein subsequently a template stripping as outlined above is performed.

The further substrate can comprise or consist of at least one of a polymerizable material, a polymer, a metal, a transition metal such as silver, a semiconductor material such as silicon, or a dielectric material such as glass.

The substrate and/or the further substrate in an unprocessed state can have a lateral expansion in the first direction and/or in the second direction of at least about 1 millimeter, preferably between about 1 millimeter to 300 millimeter. The unprocessed state refers to the state where no relief structure has been generated in the surface of the substrate and the further substrate, respectively. Additionally or alternatively it is conceivable that the substrate and/or the further substrate in an unprocessed state have an expansion in the third direction of between about 1 nanometer to 1 centimeter, preferably about 100 micrometer to 1 millimeter. The expansion in the third direction corresponds to a thickness of the unprocessed substrate and further substrate, respectively.

The relief structure preferably extends on the surface of the substrate and/or on the surface of the further substrate with a lateral expansion in the first direction and/or in the second direction of between about 100 nanometer to 50 micrometer, preferably about 1 micrometer. In other words, the relief structure preferably has a field size of one patterning area in the first and second direction in the range of between about 100 nanometer to 50 micrometer, preferably about 1 micrometer. In order to generate a large relief structure it is conceivable to stitch together one or more of these patterning areas on the surface of the substrate. Alternatively, it is likewise conceivable to generate a large relief structure consisting of a single large patterning area.

That is to say, one or more relief structures can be generated in the surface of the substrate and, if applicable, in the surface of the further substrate, wherein said one or more relief structures are preferably arranged immediately adjacent to one another or spaced apart from one another with respect to the first direction and/or the second direction. In doing so it is conceivable to produce two or more relief structures while using the same or different controller data. In other words, the relief structures can have the same or different shapes.

In another aspect of the invention, a diffractive optical element is produced by a method as described above.

In again another aspect, a diffractive optical element comprising a substrate with a surface is provided. The substrate extends in a first direction, in a second direction running perpendicularly to the first direction, and in a third direction running perpendicularly to the first direction and the second direction. The surface comprises a relief structure having a surface. At least in a portion of the relief structure a distance between the surface of the relief structure and the surface of the substrate along the third direction varies essentially continuously along at least one of the first direction and the second direction. At least the portion of the relief structure when seen along at least one of the first direction and the second direction comprises a plurality of elevations and recesses, wherein at least one of:

i. a minimal horizontal distance between at least one of a) two successive elevations and b) two successive recesses along at least one of the first direction and the second direction is smaller than about 1 micrometer, preferably smaller than about 20 nanometer, particularly preferably the minimal distance is about 10 nanometer, and ii. a minimal depth that extends in the third direction and that is formed between at least one of a) two successive elevations and b) two successive recesses along at least one of the first direction and the second direction is smaller than about 100 nanometer, preferably smaller than about 10 nanometer, particularly preferably the minimal depth is about 0.2 nanometer.

That is to say, the diffractive optical element comprises a surface having a relief structure. Said relief structure in turn defines a surface. At least a portion of the relief structure is configured such, that a distance between the surface of the relief structure and the surface of the substrate varies along the first direction and/or the second direction in an essentially continuous manner. Here, too, the expressions "essentially" and "continuous" shall be understood as described above. That is, the expressions "continuous" should be understood in its mathematical sense and the expression "essentially" shall indicate that the relief structure is continuous in so far as it is permitted by the processing device, in particular by its spatial resolution, used to generate the relief structure. To this end it should be noted that the relief structure does not need to comprise only a portion but can consist entirely of a continuous shape as just described. However, it is likewise conceivable that the relief structure can comprise at least a portion having a continuous shape as just described but also one or more portions which are of a different shape, for example of a binary shape. Moreover, at least the portion, possibly the entire relief structure, comprises minimal horizontal distances and minimal depths (or vertical distances) as just described. However, it is likewise conceivable that the relief structure comprises other portions with minimal horizontal distances and/or minimal depths being larger than said minimal horizontal distances and minimal depths. Said minimal horizontal distance could be smaller than about 100 micrometer and said minimal depth could be smaller than 10 micrometer, for example. In any case, it is possible that the relief structure comprises at least two or more successive elevations or recesses which have a larger horizontal distance and/or depth. For example, a depth of the relief structure between two successive recesses or elevations can be greater than about 10 nanometer, preferably greater than about 30 nanometer, particularly preferably greater than about 50 nanometer when seen along the third direction. A horizontal distance between two successive elevations or recesses can be greater than about 100 nanometer, preferably greater than about 10 micrometer when seen along the first and/or the second direction.

At least the portion of the relief structure can comprise a periodic or an aperiodic shape when seen along the first section extending in the first direction and/or when seen along the second section extending in the second direction. These shapes are preferably a result of the controller data that controls the probe of the processing device and that is preferably based on one or more continuous functions such as one or more sinusoidal functions as described above.

At least the portion of the relief structure is preferably configured such, that at least one beam of electromagnetic radiation having a given wavelength can be incident on the portion of the relief structure under at least one desired incoming angle and can be diffracted under at least one desired outgoing angle. That is to say, at least the portion of the relief structure preferably has a shape so that a beam of electromagnetic radiation with a given wavelength can be incident on the portion of the relief structure at any desired incoming angle where it will then be diffracted to any desired one or more outgoing angles. This can also be achieved for more than one beam of electromagnetic radiation, where for each beam, at least the portion of the relief structure contains a periodic or aperiodic component that will diffract the beam from the desired incoming angle to the desired outgoing angle. In other words, at least the portion of the relief structure is preferably configured such that the above-explained momentum-matching equation is fulfilled. Alternatively, it is also conceivable that at least the portion of the relief structure is configured such, that the at least one beam of electromagnetic radiation being incident on the portion of the relief structure under at least one desired incoming angle is diffracted from the portion of the relief structure in a manner that the diffracted outgoing electromagnetic radiation interferes to form a specific light field. If one beam of electromagnetic radiation is incident on the portion of the relief structure the thus produced interference pattern is constituted by two or more interfering wavefronts that are generated upon the diffraction of said one incoming electromagnetic beam. However, the generation of an interference pattern is likewise possible for the case where two or more incoming beams of electromagnetic radiation are diffracted from the portion of the relief structure such that the diffracted outgoing electromagnetic radiation interferes to form a specific light field, wherein said interference pattern is constituted by two or more interfering wavefronts of the two or more incoming beams. In other words, the portion of the relief structure can be configured such, that one or more beams of electromagnetic radiation are diffracted at the relief structure in such a manner that they interfere to produce a specific light field. Such a relief structure is particularly desirable in the field of computer-generated holograms, for example.

At least the portion of the relief structure can be configured such, that at least a first beam of electromagnetic radiation having a first wavelength and being incident on the portion of the relief structure under a first incoming angle is diffracted under a first outgoing angle and a second beam of electromagnetic radiation having a second wavelength differing from the first wavelength and being incident on the portion of the relief structure under a second incoming angle is diffracted under a second outgoing angle, wherein:
  i. the first incoming angle essentially equals the second incoming angle and the first outgoing angle essentially equals the second outgoing angle, or
  ii. the first incoming angle essentially equals the second incoming angle and the first outgoing angle differs from the second outgoing angle, or
  iii. the first incoming angle differs from the second incoming angle and the first outgoing angle essentially equals the second outgoing angle, or
  iv. the first incoming angle differs from the second incoming angle and the first outgoing angle differs from the second outgoing angle.

The incoming angle and the outgoing angle are defined with respect to a direction being normal to the surface of the substrate.

As outlined previously, the method according to the invention enables the generation of a relief structure that is adapted to the end application of the diffractive optical element. To this end the surface relief structure can be generated by controller data that is based on one or more sinusoidal functions, wherein predetermined values of the amplitude $A_n$, the spatial frequency $k_n$, the angular direction $\alpha_n$, the phase $\varphi_n$, and the offset $\Delta_n$ are used. In this way it is possible to generate a surface relief structure that satisfies one of the criteria i. to iv. listed above.

For example, if the diffractive optical element shall be used as a so-called RGB-coupler, i.e. a multi-colour red-green-blue-coupler as it is preferably used in augmented reality devices, the relief structure is preferably configured according to criteria i. mentioned above. That is, the relief structure is preferably configured such, that the three beams of electromagnetic radiation differing in their wavelengths (here: $\lambda_1=650$ nm, $\lambda_2=550$ nm, $\lambda_3=475$ nm) are incident on the relief structure under a common particular incoming angle and are diffracted at the relief structure under a common particular outgoing angle. The common incoming angle is defined with respect to a direction being normal to the surface of the substrate and is preferably 0°. The common outgoing angle is defined with respect to the direction being normal to the surface of the substrate and is preferably 90°. Thus, the beams are diffracted at the relief structure in such a manner that they propagate parallel to one another and to the surface of the substrate as well as perpendicular with respect to the direction of incidence. However, it is also possible to produce a relief structure being configured such, that one or more beams of electromagnetic radiation are diffracted at the relief structure in such a manner that they interfere to produce a specific light field. Such a relief structure would be desirable in the field of computer-generated holograms, for example.

In another aspect, a virtual image display device is provided, which virtual image display device comprises a source of radiation, preferably an image display element, a substrate, and at least a first and a second diffractive optical element as described above. The source of radiation is configured to emit at least one beam of electromagnetic radiation, preferably at least one image frame. The first diffractive optical element is arranged on or in the substrate such, that the at least one beam of electromagnetic radiation being incident on the first diffractive optical element is coupled into the substrate and propagates along the substrate. The second diffractive optical element is arranged on or in the substrate such, that the propagating at least one beam of electromagnetic radiation is coupled out of the substrate.

In another aspect a virtual image display device is provided, which virtual image display device comprises a source of radiation, a substrate, and at least one diffractive optical element as described above. The source of radiation is configured to emit at least one beam of electromagnetic radiation. The diffractive optical element is arranged on or in the substrate such, that the at least one beam of electromagnetic radiation being incident on the diffractive optical element is diffracted in a manner that the diffracted outgoing electromagnetic radiation interferes to form a specific light field.

It is conceivable that said virtual image display device comprises a diffractive optical element being configured and arranged such, that the at least one beam of electromagnetic radiation being emitted from the source of radiation is incident on said diffractive optical element, and wherein the at least one beam of electromagnetic radiation is then diffracted in a manner that the diffracted outgoing electromagnetic radiation interferes to form the specific light field. However, it is likewise conceivable that the virtual image display device comprises two or more diffractive optical elements as described above. In this case one of the diffractive optical elements could be used to couple the electromagnetic radiation being emitted from the source of radiation into the substrate, where the thus in-coupled electromagnetic radiation propagates along the substrate. The other diffractive optical element could be configured and arranged on the substrate such, that the propagating electromagnetic radiation is diffracted and coupled-out of the substrate in a manner that the diffracted outgoing electromagnetic radiation interferes so form the specific light field as described above.

Moreover, it is conceivable that the image display devices in each case comprise one or more optical systems, for example a first optical system that is configured to receive the at least one beam of electromagnetic radiation, for example an image frame from the image display element, and to relay the at least one beam of electromagnetic radiation to the first diffractive optical element. The virtual image display can comprise further components such as a further optical system, wherein said further optical system is arranged and configured such as to receive the at least one electromagnetic radiation such as the image frame being coupled out of the substrate and to relay said at least one beam of electromagnetic radiation to an outside. The substrate in each case preferably corresponds to a material having a high refractive index. Such a substrate is also referred to as optical waveguide. Hence, the image display element, the optical system and the optical waveguide preferably correspond to components as they are known in the art. Moreover, the virtual image display can be configured so as to be worn by a user.

The fact that diffractive optical elements according to the invention are used enables the provision of a virtual image display device that is compact and at the same time enables a complete control over the Fourier spectrum of the images that are generated by the image display element and diffracted by the diffractive optical element.

BRIEF DESCRIPTION OF THE DRAWINGS

Preferred embodiments of the invention are described in the following with reference to the drawings, which are for the purpose of illustrating the present preferred embodiments of the invention and not for the purpose of limiting the same. In the drawings.

FIG. 2b shows schematic illustrations of different diffractive optical elements that are obtained by the fabrication pathways according to FIG. 2a;

FIG. 8b shows a cross-section of the bitmap taken along the dashed line A-A of FIG. 8a;

FIG. 9b shows a cross-section of the topography taken along the dashed line B-B of FIG. 9a;

FIG. 10b shows a spectrally-resolved reflection measurement at normal incidence of the diffractive optical element according to FIG. 10a;

FIG. 11b shows a cross-section of the bitmap taken along the dashed line C-C of FIG. 11a;

FIG. 12b shows a cross-section of the topography taken along the dashed line D-D of FIG. 12a;

FIG. 14b shows topography data for the two-dimensional model relief structure according to FIG. 14a;

DESCRIPTION OF PREFERRED EMBODIMENTS

In FIGS. 1a to 2b different aspects regarding the method of producing a diffractive optical element 1 comprising a relief structure 2 according to the invention are disclosed. The underlying physical relationship associated with the generation of the relief structure 2 and the resulting diffraction scenarios are illustrated in FIGS. 3 to 7. With respect to FIGS. 8 to 14d different examples of diffractive optical elements 1 according to the invention are shown and aspects regarding their production and characterization are discussed.

Figure 1A:
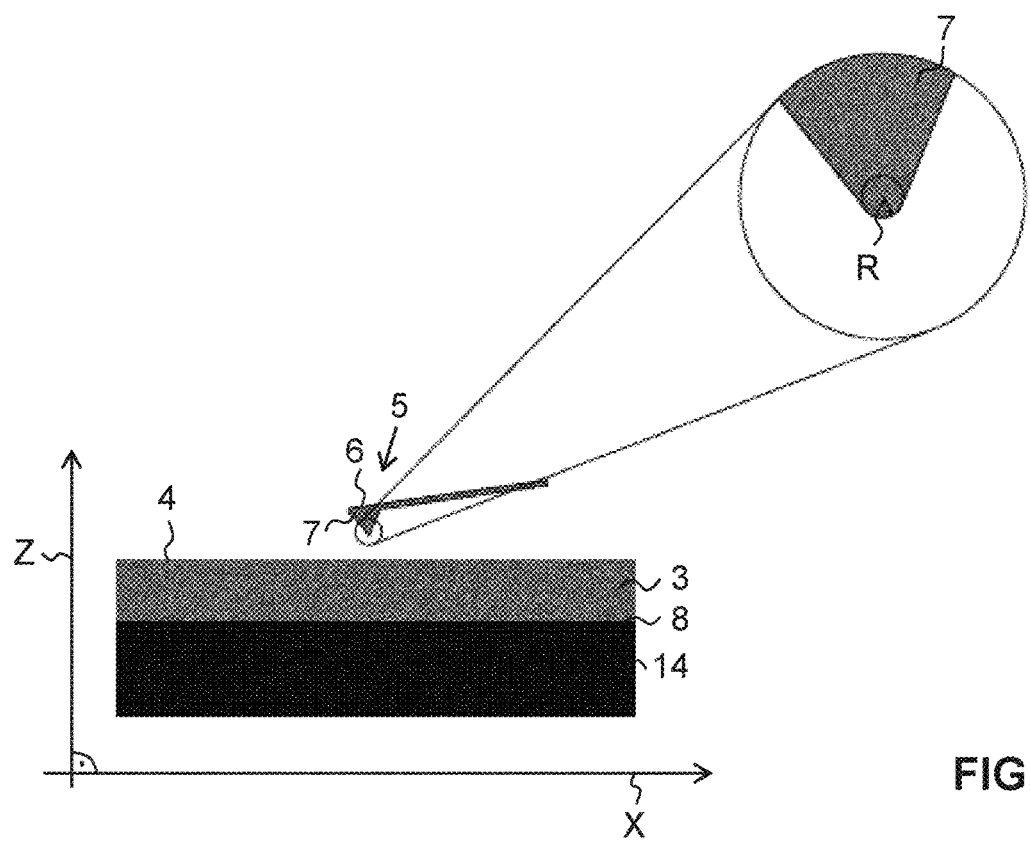
FIG. 1a shows a schematic illustration of a method of producing a diffractive optical element according to the invention in a first state, wherein a processing device comprising a probe is about to act on a surface of a substrate in order to generate a relief structure.
Figure 1B:
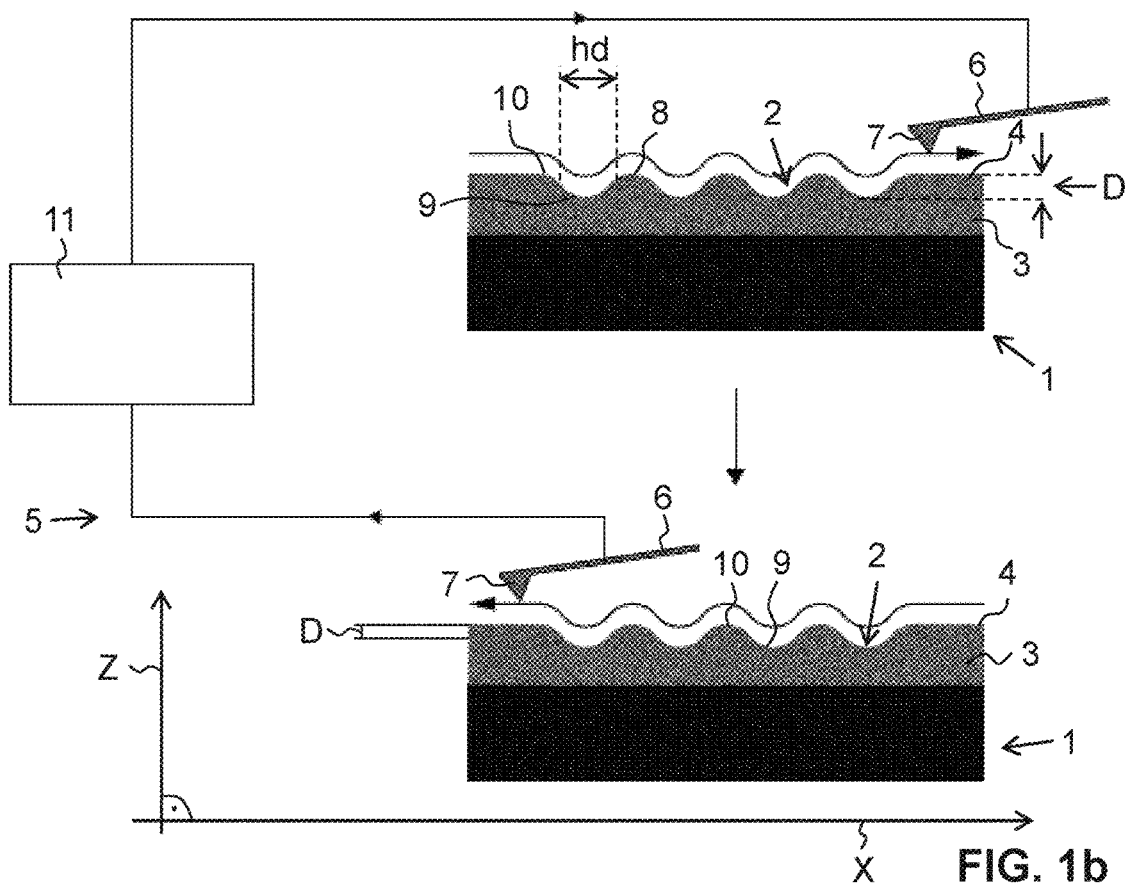
FIG. 1b shows a schematic illustration of the method of producing a diffractive optical element according to FIG. 1b in a second state, wherein the processing device comprising the probe acts on the surface of the substrate.

Hence, as follows from FIGS. 1a and 1b the method of producing a diffractive optical element 1 according to the invention comprises the steps of providing at least one substrate 3 having a surface 4 and generating a relief structure 2 in the surface 4 of the substrate 3 using a processing device 5. The substrate 3 extends in a first direction x, a second direction y running perpendicularly to the first direction x, and a third direction z running perpendicularly to the first direction x and the second direction y. The surface 4 of the substrate 3 extends in the first direction x and the second direction y, said first direction x and second direction y spanning a horizontal plane x-y. The processing device 5 comprises a prove 6 having a tip 7. The tip 7 has a radius R that is about 10 nanometer. The probe 6, and thus the tip 7, is movable in the first direction x, the second direction y and the third direction z with respect to the substrate 3. The relief structure 2 is generated by an action of the tip 7 on the surface 4 of the substrate 3 such that a distance D between a surface 8 of the relief structure 2 and the surface 4 of the substrate 3 along the third direction z varies essentially continuously along at least one of the first direction x and the second direction y, see e.g. FIGS. 4-7, 9a, 10a, 12a, 13a and 14c. As follows from FIG. 1b, for example, the surface 4 of the substrate 3 is understood as the surface of the substrate 3 before the substrate 3 has been processed by the processing device 5. In other words, after a processing of the substrate 3 by the processing device 5 said surface 4 corresponds to the surface of the substrate outside a region comprising the relief structure 2. This in turn means that the surface 8 of the relief structure 2 corresponds to the surface of the substrate 3 that comprises the relief structure 2. The probe 6 is movable in the first direction x and in the second direction y in steps of about 0.1 nanometer to 50 micrometer, for example in steps of less than about 20 nanometer, and the probe 6 is movable in the third direction z in steps of about 0.1 nanometer to 1 micrometer, preferably in steps of less than about 2 nanometer. Due to these small movement steps a relief structure 2 comprising a plurality of recesses 9 and elevations 10 is generated, wherein a minimal horizontal distance hd between two successive elevations 10 and recesses 9 along the first direction x and the second direction y is about 10 nanometer and a minimal depth vd that extends in the third direction z is about 0.2 nanometer. The tip 9 is further configured to scan over the surface 8 of the relief structure 2 while it is acting upon the surface 4 of the substrate 3. This generates a closed-loop feedback system that results in an accurate and precise profile of the surface relief structure 2. This reading process is schematically indicated by the corrugated arrow in FIG. 1b.

The particular movements of the probe 6 are carried out according to particular controller data that is fed to a controller 11 of the processing device 5 being configured to control the probe 6. Said controller data defines the relief structure 2 along the horizontal plane x-y and in the present examples is based on one sinusoidal function $f_{n=1}(x,y)$ (see FIGS. 8a to 10b) or on three sinusoidal functions $f_{n=3}(x,y)$ (see FIGS. 11a to 13b), wherein $f_n(x,y)=A_n \sin(k_n(x \cos \alpha_n - y \sin \alpha_n)+\varphi_n)+\Delta_n$. However, it should be noted that any number of sinusoidal functions are conceivable. In the case of two or more sinusoidal functions said sinusoidal functions are summed up in a Fourer Series $F(x,y)=\Sigma_n f_n(x,y)$. The parameters in this expression correspond to the amplitude $A_n$, the spatial frequency $k_n$, the angular direction $\alpha_n$ along the horizontal plane x-y, the phase $\varphi_n$, and the offset $\Delta_n$ with respect to the third direction z.

Figure 2A:
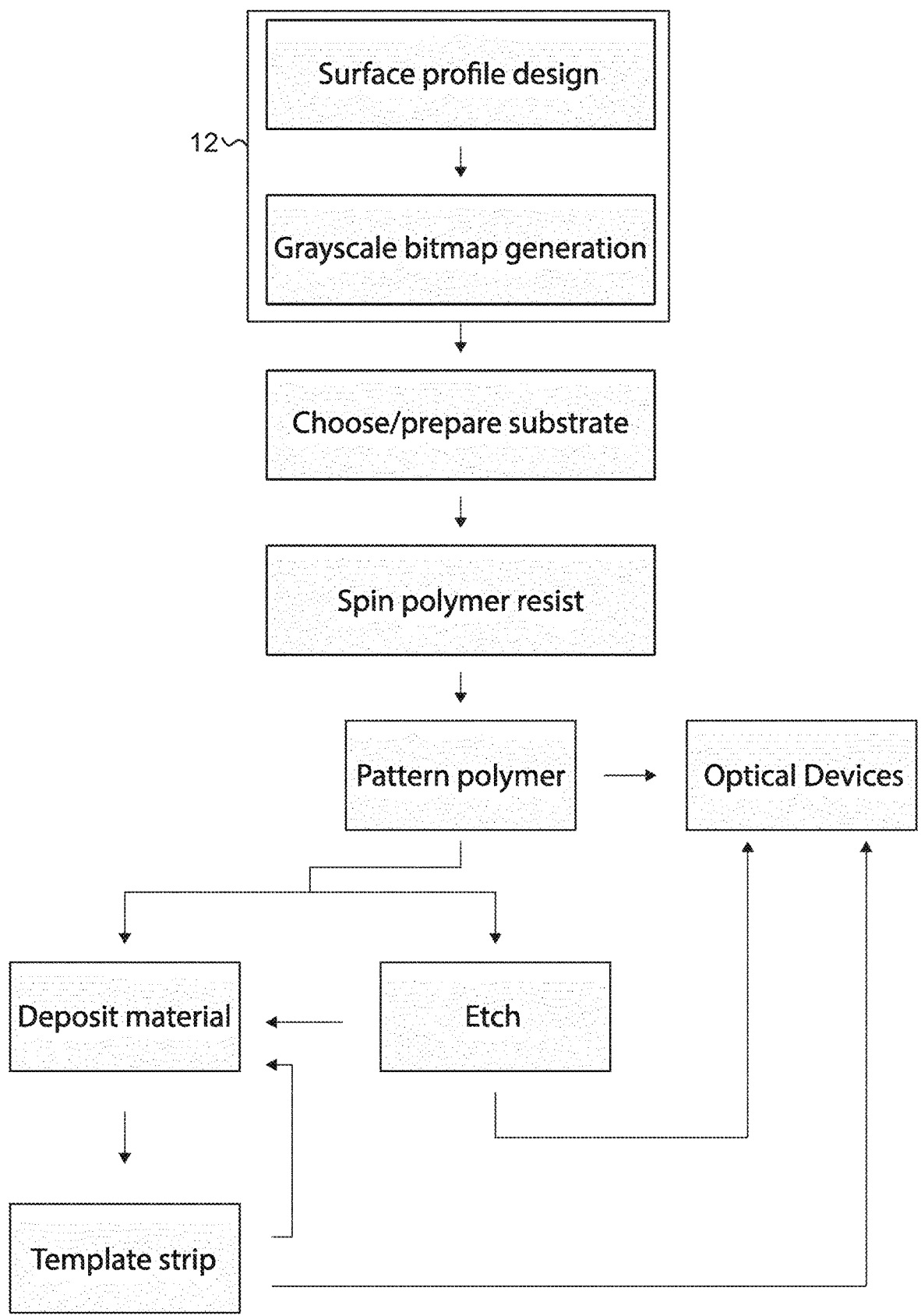
FIG. 2a shows different fabrication pathways for producing diffractive optical elements according to the method of the invention.

As follows from FIG. 2a, said one sinusoidal function or Fourier Series is generated in a computing device 12, whereby a so-called model relief structure of Fourier surface design is obtained. In a next step, said model relief structure is discretized into pixels, whereby discretized controller data is obtained that is stored in a digital file such as a bitmap file. In FIG. 2a this step is referred to as grayscale bitmap generation, since the continuity provided by the sinusoidal functions results here in a grayscale bitmap. Depending on the desired end application of the diffractive optical element 1, an adequate fabrication scheme is then selected for the further production of the diffractive optical element 1.

Figure 2B:
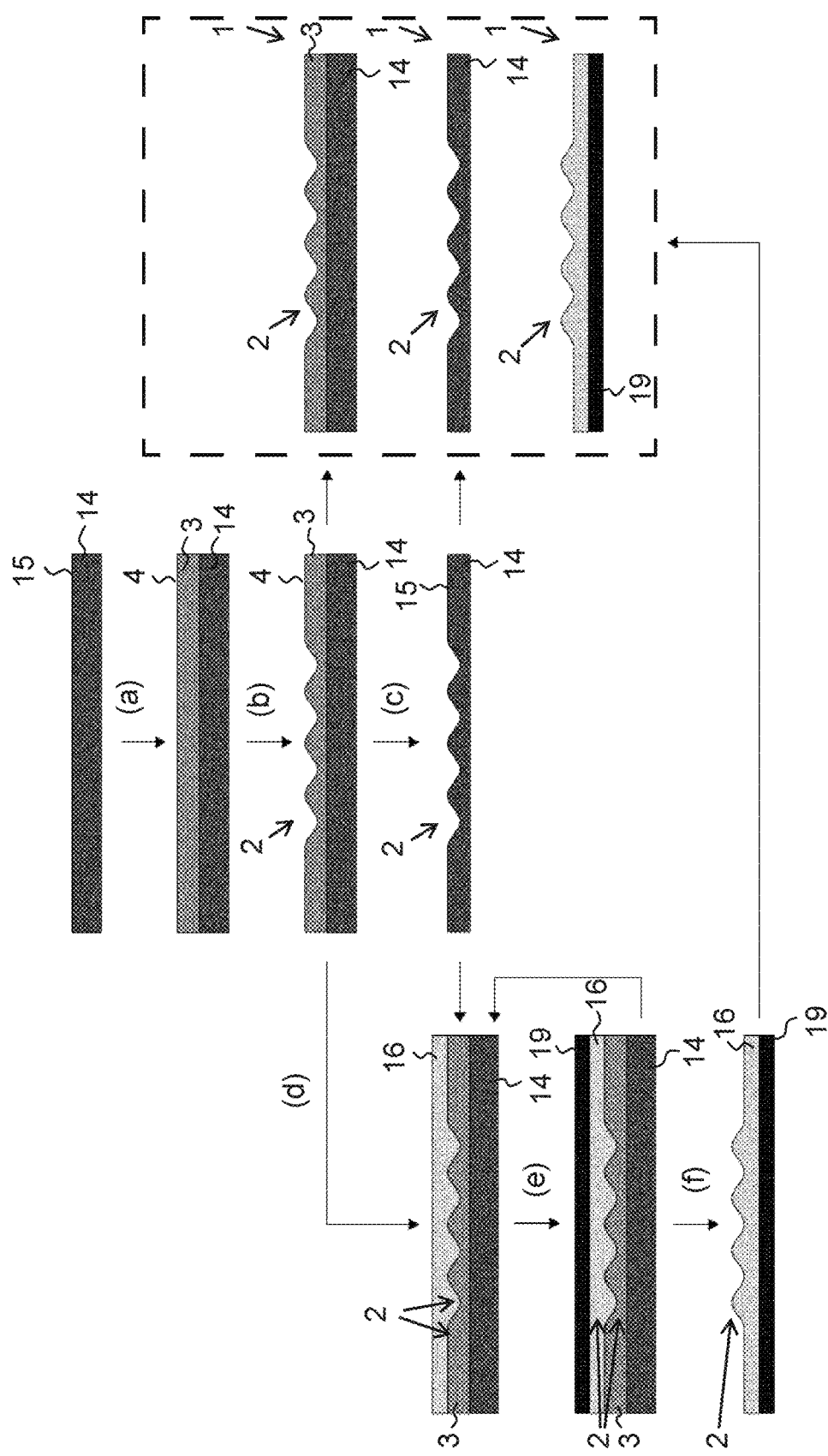

As further follows from FIGS. 1, 2a and 2b, said different fabrication schemes encompass direct writing, etching or template stripping as they are known in the art. That is, the substrate 3 can be a polymer such as PPA or PMMA/MA, wherein the relief structure 2 is generated into the surface 4 of said substrate 3 by the action of the probe 6 on the surface 4, and whereby the diffractive optical element 1 is obtained. This process is depicted in FIG. 1. However, and as follows from FIG. 2b, it is also conceivable to apply such a polymer substrate 3 on the surface 15 of a further substrate 14 by means of spin coating, see step (a) for example. In a next step (b) the relief structure 2 is generated in the surface 4 of the polymer being applied to the further substrate 14 by means of the tip 7 acting on the surface 4. Thereby, another diffractive optical element 1 is generated. However, a different diffractive optical element 1 is obtained if said two-layer structure consisting of the polymer substrate 3 and the further substrate 14 is subject to an etching process or a template stripping process, see step (c). In the former case a dielectric film or a metal film or a transition metal film such as a silver film 16 can be applied on the relief structure 2 generated in the polymer layer 3 whereby the relief structure 2 is generated in the film 16, see step (d). In a further step, a curable resin such as a UV-curable epoxy resin is deposited on said film 16. Again in a further step (e), a carrier 19 such as a glass plate is applied to the curable resin. Then, the curable resin is cured In a next step (f), the carrier 19, the cured resin and the film 16 comprising the relief structure 2 are removed from the substrate 3. The thus produced relief structure 2 generated by template stripping corresponds to a diffractive optical element 1. In the present examples the production of such grayscale diffractive optical elements 1 is conducted with a tip 7 being heated to a temperature of approximately 750° C., a typical pixel size of approximately 10 nm, a total depth of the relief structure 2 in the third direction z of approximately 50-100 nm, and a dimension of the relief structure 2 in the horizontal plane x-y of approximately 10-20 micrometer.

In the following, different diffractive optical elements 1 that are obtained by the method according to the invention are discussed in greater detail. All of these diffractive optical elements 1 have in common that the controller data that was used to control the probe 6 of the processing device 5 is based on one or more sinusoidal functions having predetermined values of their parameters.

Figure 3:
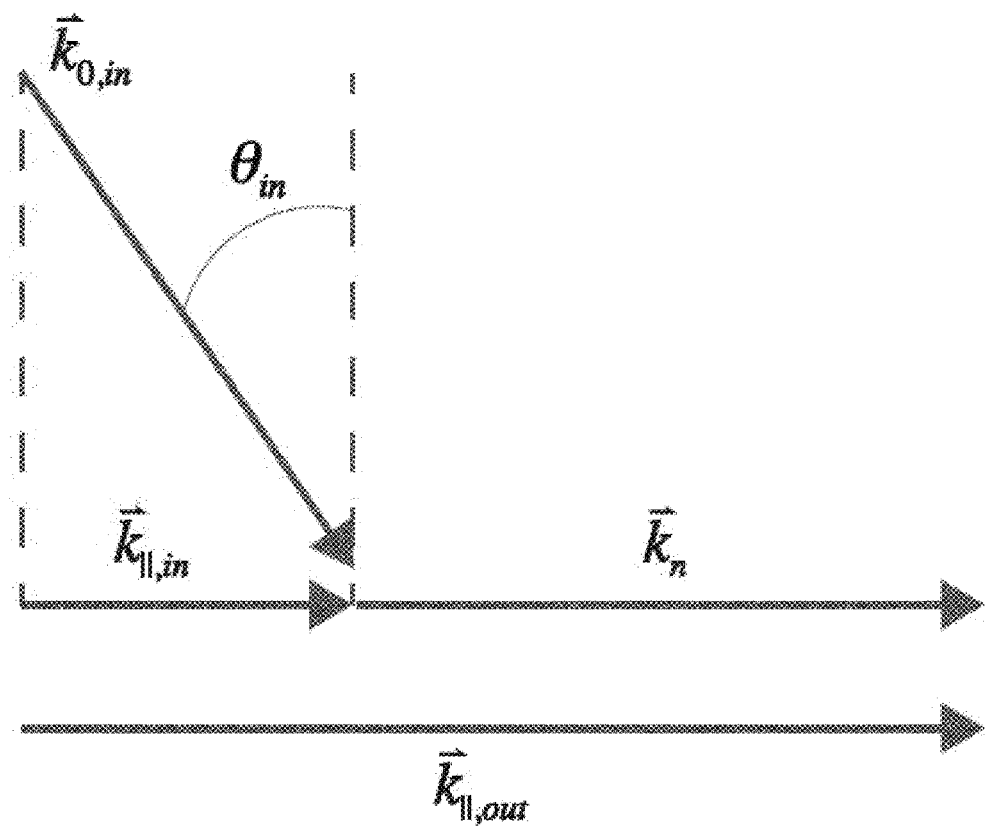
FIG. 3 shows a schematic illustration of the physical relationship applying in the determination of the spatial frequency of the relief structure according to the method of the invention.
Figure 4:
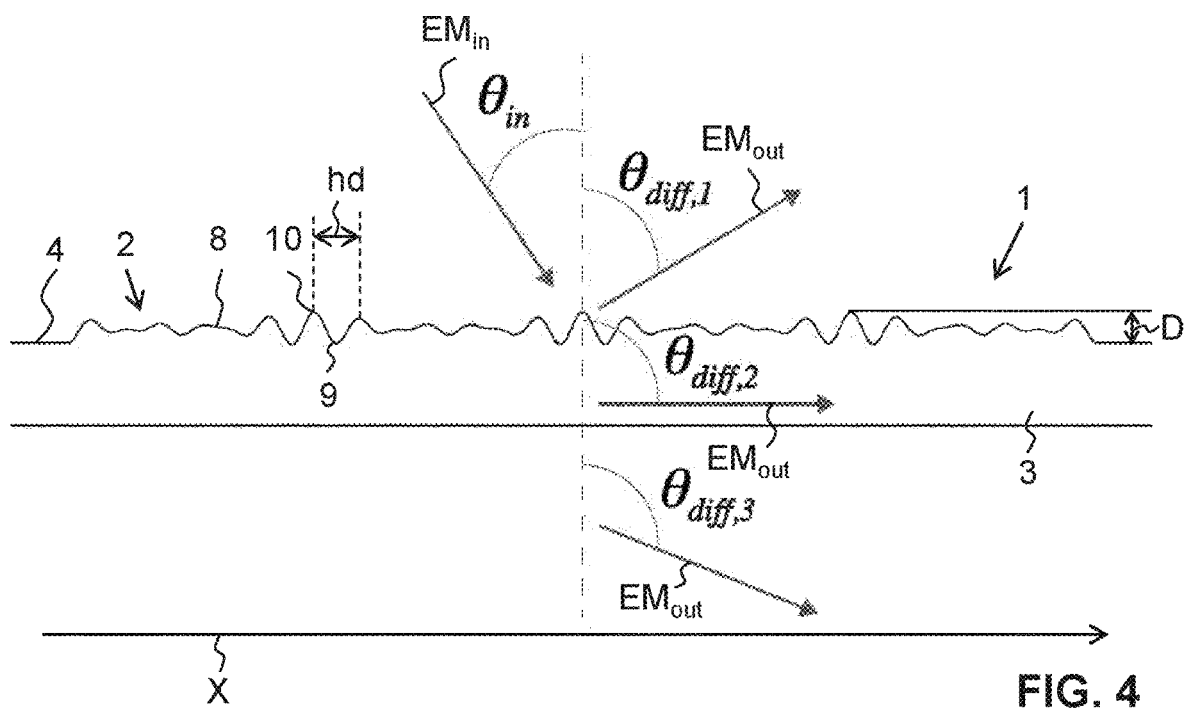
FIG. 4 shows a schematic illustration of possible diffraction scenarios when electromagnetic radiation impinges on the relief structure of a diffractive optical element according to another embodiment of the invention.

One underlying physical principle that was utilized corresponds to the momentum-matching principle, which enables a choice of the spatial frequency of the relief structure 2 of the diffractive optical element 1 such that the in-plane wavevector of the incident electromagnetic radiation is matched to the in-plane wavevector of the outgoing electromagnetic radiation. Said principle is described in greater detail in the section "summary of the invention" of this application and is schematically illustrate in FIG. 3. In FIG. 3, $\vec{k}_{out}$ is the in-plane wavevector of the outgoing electromagnetic radiation, $\vec{k}_{in}$ is the in-plane wavevector of the incident electromagnetic radiation, $\hat{k}_{0,in}$ is the unit vector along the direction of propagation of the incident electromagnetic radiation, $\vec{k}$ is the wavevector of the diffractive optical element 1, and $\theta_{in}$ is the angle of the incident electromagnetic radiation relative to a normal direction (dashed line).

Figure 5:
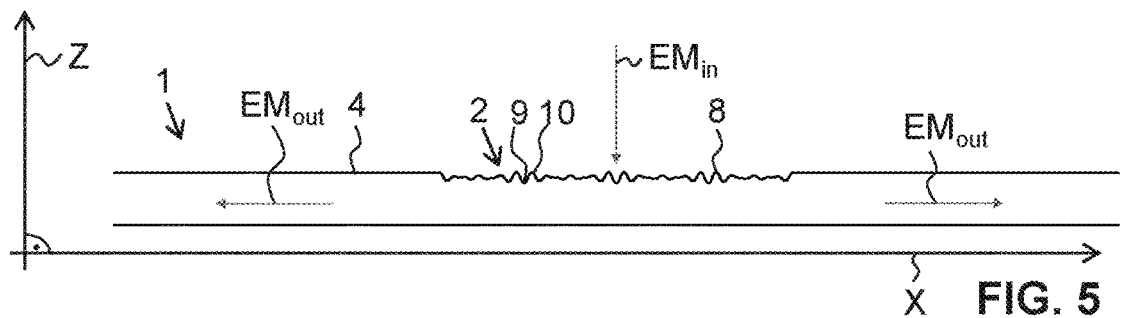
FIG. 5 shows a schematic illustration of another possible diffraction scenario when electromagnetic radiation impinges on the relief structure of a diffractive optical element according to another embodiment of the invention.
Figure 6:
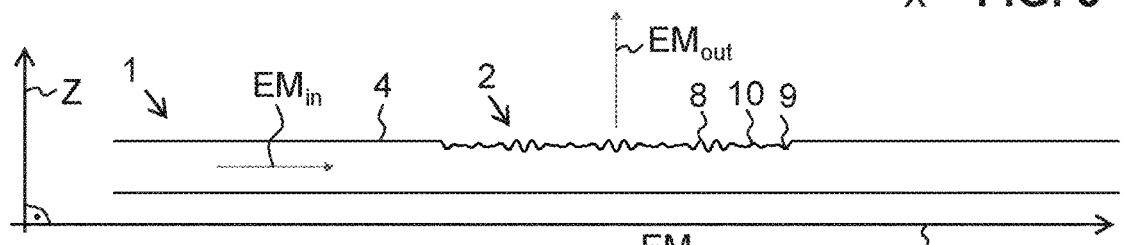
FIG. 6 shows a schematic illustration of another possible diffraction scenario when electromagnetic radiation impinges on the relief structure of the diffractive optical element according to FIG. 5.
Figure 7:
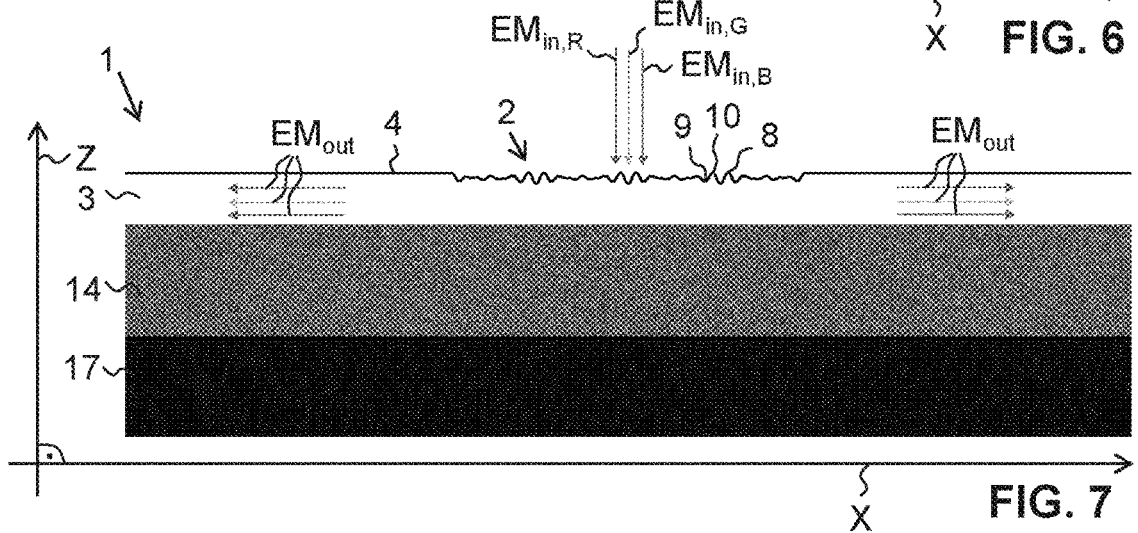
FIG. 7 shows a schematic illustration of another possible diffraction scenario when electromagnetic radiation impinges on the relief structure of a diffractive optical element according to another embodiment of the invention.

In FIGS. 4 to 7 different conceivable diffraction scenarios are depicted. Namely, in FIG. 4 electromagnetic radiation $EM_{in}$ with a given wavelength is incident on the relief structure 2 of a diffractive optical element 1 according to the invention at an angle $\theta_{in}$. In the present example said electromagnetic radiation $EM_{in}$ is incident from above the relief structure 2, for example from a top layer (not shown) that is applied on top of the surface 4 of the substrate 3 comprising the relief structure 2. It should be noted that a top layer is not a requirement. Instead, it is likewise conceivable that no top layer is present and that the electromagnetic radiation is incident from a vacuum environment or air environment. Moreover, it should be noted that it can be incident on the relief structure 2 from any direction, such as from within the substrate 3 comprising the relief structure 2 or from below. The incident electromagnetic radiation $EM_{in}$ diffracts as outgoing electromagnetic radiation $EM_{out}$ from the relief structure 2 and depending on the design of the relief structure 2 it can diffract such that it travels in the direction back to the top layer ($\theta_{diff,1}$), into the substrate 3 ($\theta_{diff,2}$), or diffract through the substrate 3 to another side ($\theta_{diff,3}$). FIG. 5 depicts an embodiment of a grayscale diffractive optical element 1 according to the invention where the relief structure 2 is generated directly in a substrate 3 being a waveguide layer such that incident electromagnetic radiation $EM_{in}$ from a top layer (not shown) diffracts to a waveguide mode $EM_{out}$ that travels along the substrate 3. FIG. 6 depicts an embodiment of a grayscale diffractive optical element 1 where the relief structure 2 is generated directly in a substrate 3 being a waveguide layer such that incident electromagnetic radiation $EM_{in}$ from the waveguide layer diffracts to a freespace mode that propagates as $EM_{out}$ in a top layer (not shown). The same can be achieved for a mode that diffracts into a bottom layer of a diffractive optical element 1. In particular, FIG. 7 depicts an embodiment of a diffractive optical element 1 according to the invention which acts as a RGB coupler in a waveguide layer stack that is commonly used in augmented-reality devices. Here, the substrate 3 in the form of a top layer corresponds to a layer being made of a polymer having a high refractive index, such as CSAR. However, other materials having a high refractive index are likewise conceivable. Said top layer has a higher refractive index than the further substrate 14 in the form of a middle layer such that the top layer supports a waveguide mode. Conceivable materials for said middle layer 14 are thermally grown silicon dioxide ($SiO_2$) and the like. Red, green, and blue light $EM_{in}$ (further distinguished by the letters "R", "G" and "B") reaches the diffractive optical element 1 from normal incidence and diffracts to an angle such that it couples to the waveguide mode and travels along the waveguide as $EM_{out}$. Moreover, a further substrate 17 forming a bottom layer is arranged after the middle layer 14 when seen from the top layer 3 towards the middle layer 14 along the third direction z. Said bottom layer 17 can be made of Silicon, although other materials are likewise conceivable.

Figure 8A:
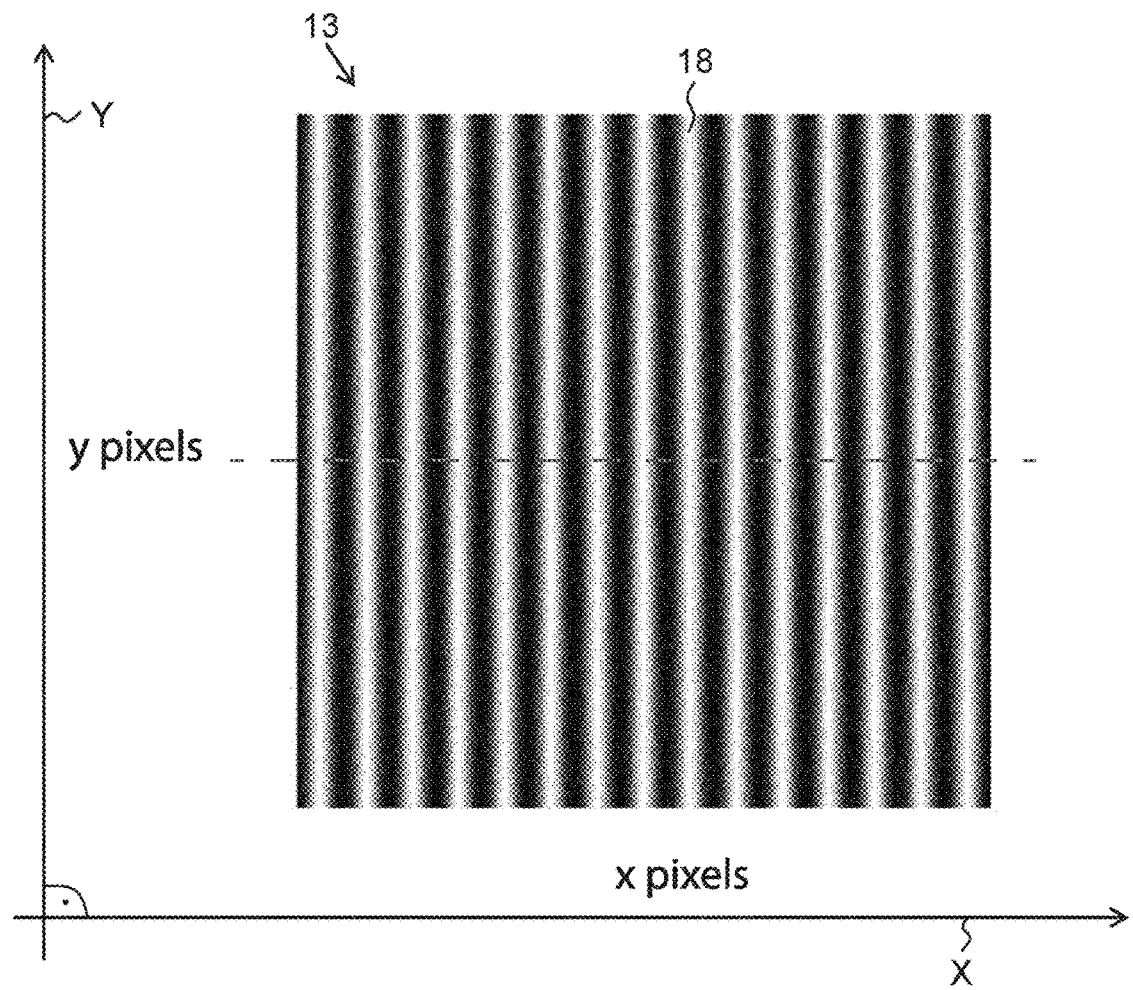
FIG. 8a shows a bitmap for a single sinusoidal model relief structure.
Figure 8B:
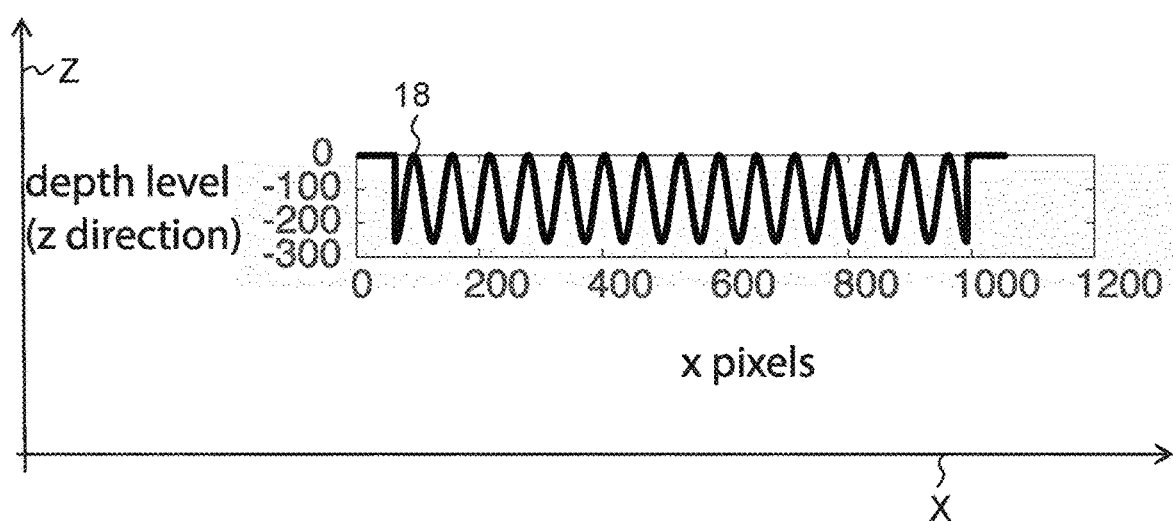

As mentioned initially, depending on the end application of the diffractive optical element 1 the controller data can be based on predetermined values of the amplitude $A_n$, the spatial frequency $k_n$, the angular direction $\alpha_n$, the phase $\varphi_n$, and the offset $\Delta_n$ that are used to define the model relief structure 18 based on sinusoidal functions. FIG. 8a depicts a grayscale bitmap 13 for a single sinusoidal surface relief. The sinusoidal modulation is along the first direction x, and the model relief structure 18 is constant along the second direction y. The bitmap 13 is constructed using square pixels with a side length of 10 nm. The model relief structure 18 is divided into 256 depth levels (8-bit precision) along the third direction z, see FIG. 8b.

Figure 9A:
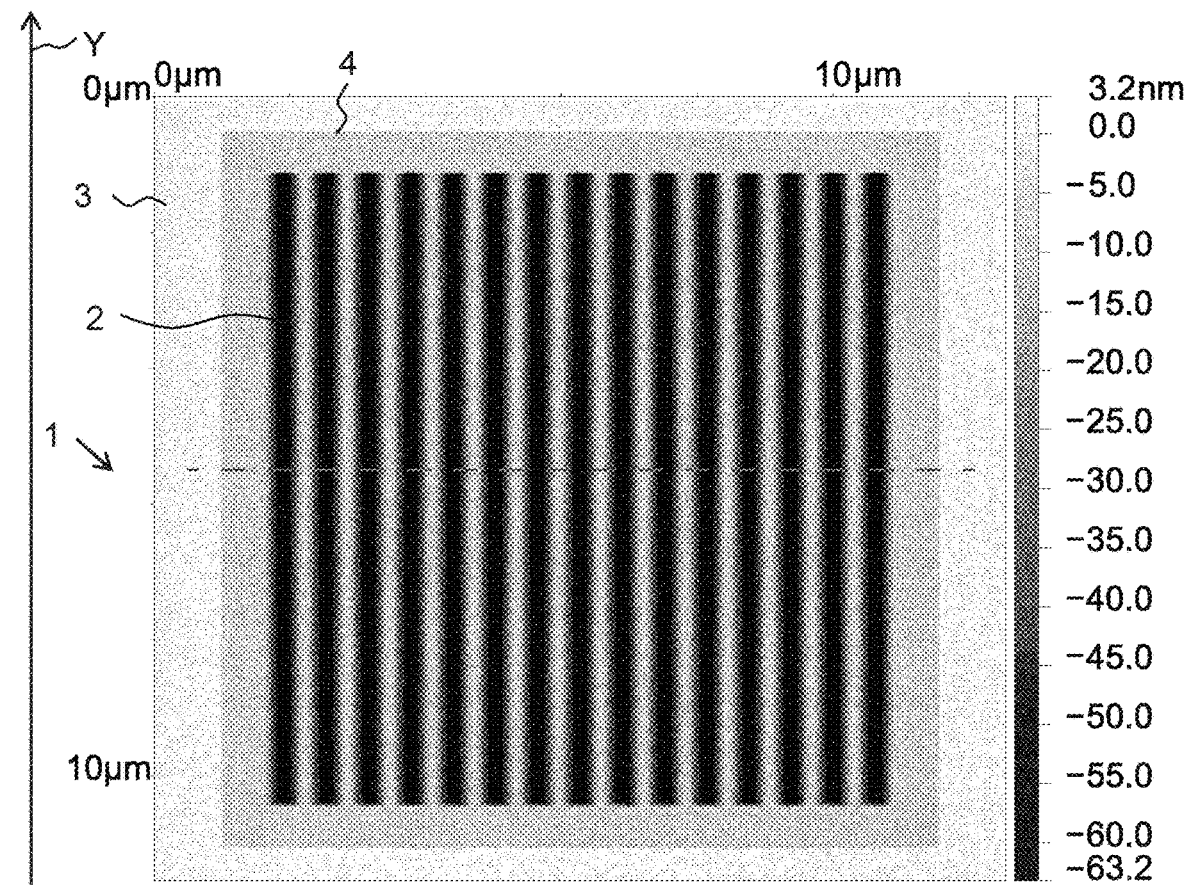
FIG. 9a shows a topography of a diffractive optical element comprising a relief structure in the shape of a single sinusoidal profile according to the invention.
Figure 9B:
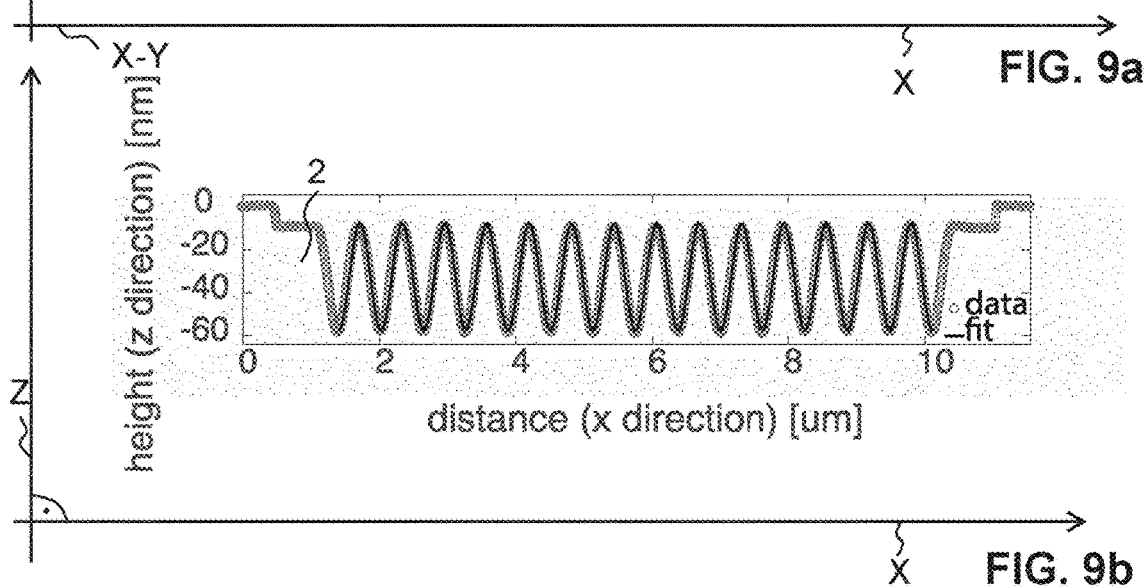

FIG. 9a depicts a topography of a single sinusoidal relief structure 2 that has been generated in polymer resist 3. The topography is measured in situ by the thermal scanning probe 6 during the patterning process. The grayscale colour map indicates the height of the measured points, where the zero value is normalized to the flat surface 4 outside the patterned region 2. The cross-section of the topography taken along the dashed line in FIG. 9a has been averaged over 1 micrometer (100 pixels). The black line is a fit of the desired relief structure 2, in this case a single sinusoid, which was used to generate the bitmap 13 and the relief structure 2. The fitted sinusoidal function is represented by the formula $f(x)=A \sin(kx-\varphi)+\Delta$. The fit parameters return values of 24.8 nm, 10.1 micrometer$^{-1}$, −3.14 radians, −32.9 nm for the parameters defining the amplitude, spatial frequency, phase, and offset, respectively, of the sinusoidal function.

Figure 10A:
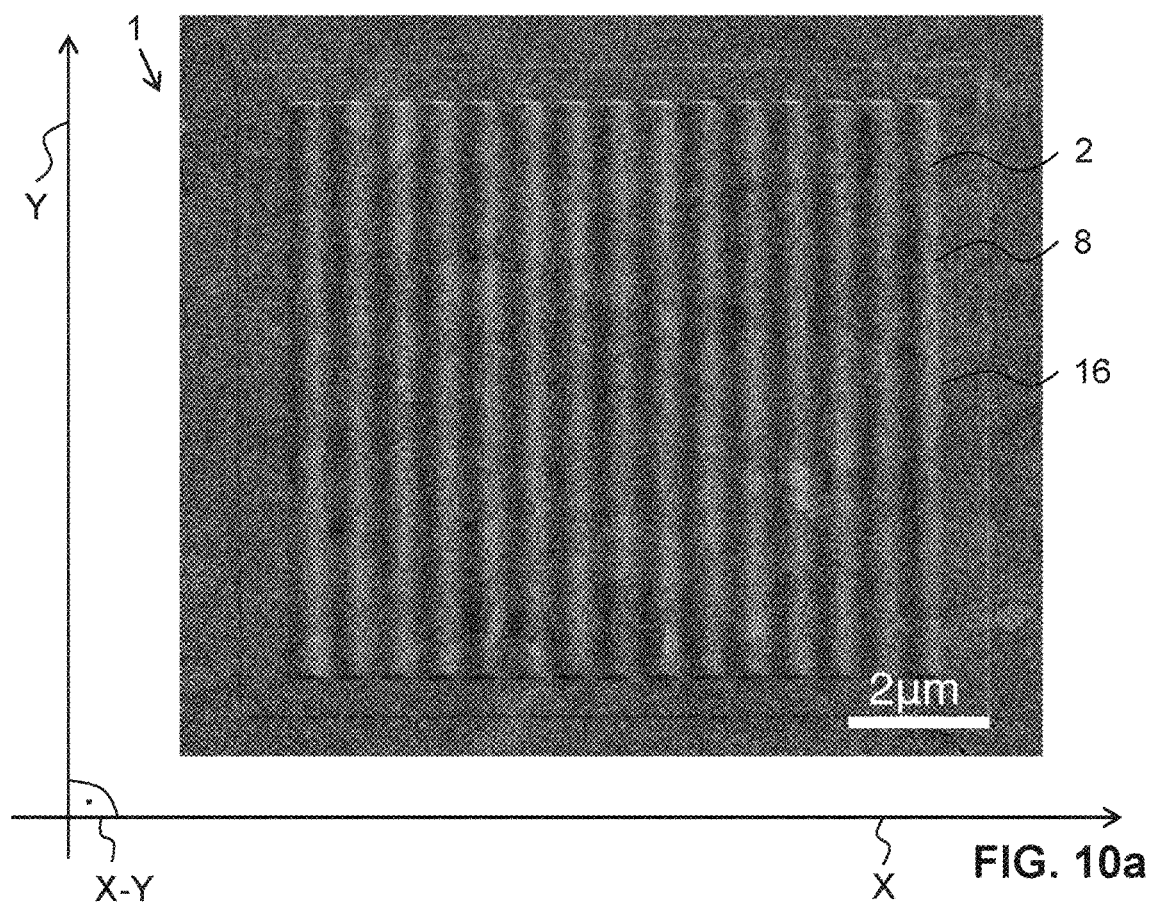
FIG. 10a shows a scanning electron micrograph of a diffractive optical element comprising a relief structure in the shape of a single sinusoidal profile according to the invention.
Figure 10B:
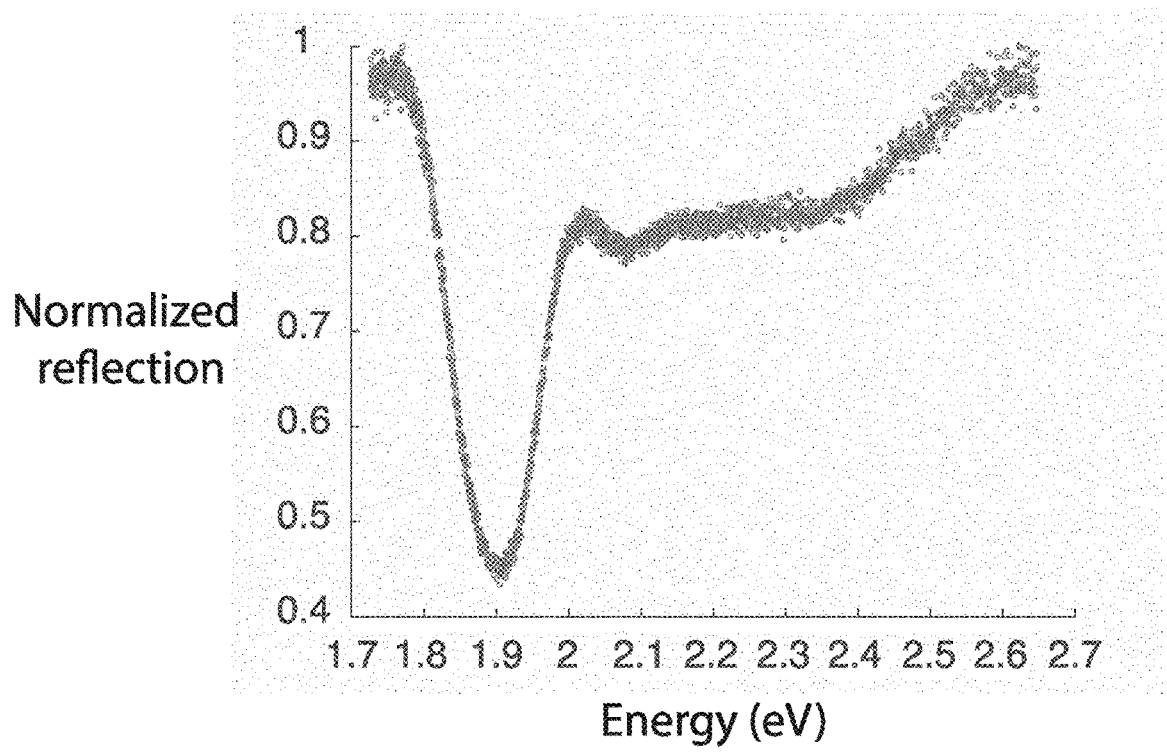

FIG. 10a depicts a scanning electron micrograph of a single sinusoidal relief structure 2 generated on a silver surface 16. The relief structure 2 was transferred to the silver surface 16 using template stripping, where the polymer surface 4 in FIG. 9a was used as the template. FIG. 10b corresponds to a spectrally-resolved reflection measurement at normal incidence of the single sinusoidal relief structure 2 on the silver surface 16 depicted in FIG. 10a. The dip in reflectivity at a photon energy of ~1.9 eV shows that electromagnetic radiation being incident on the relief structure 2 is diffracted to modes that propagate along the silver surface 16.

Figure 11A:
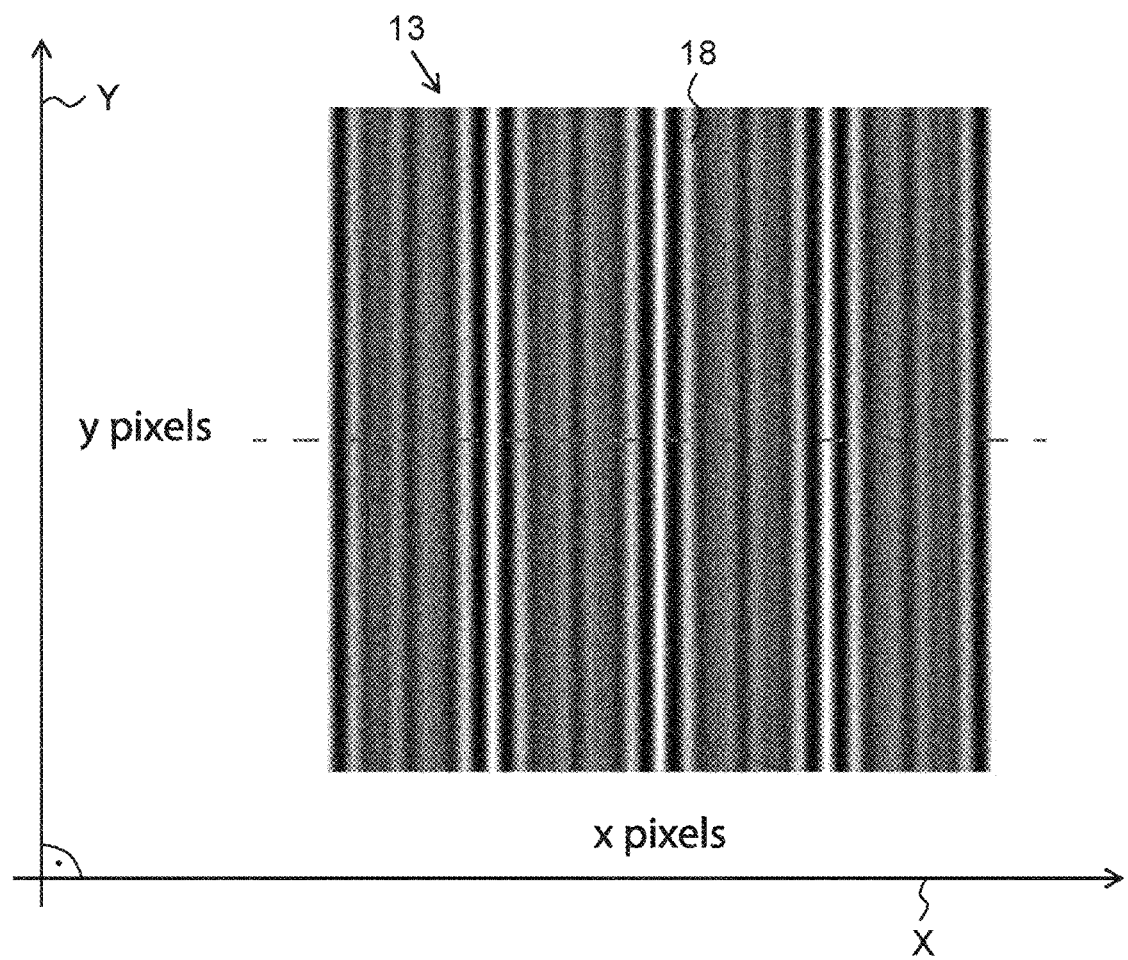
FIG. 11a shows a bitmap for a three-component sinusoidal model relief structure.
Figure 11B:
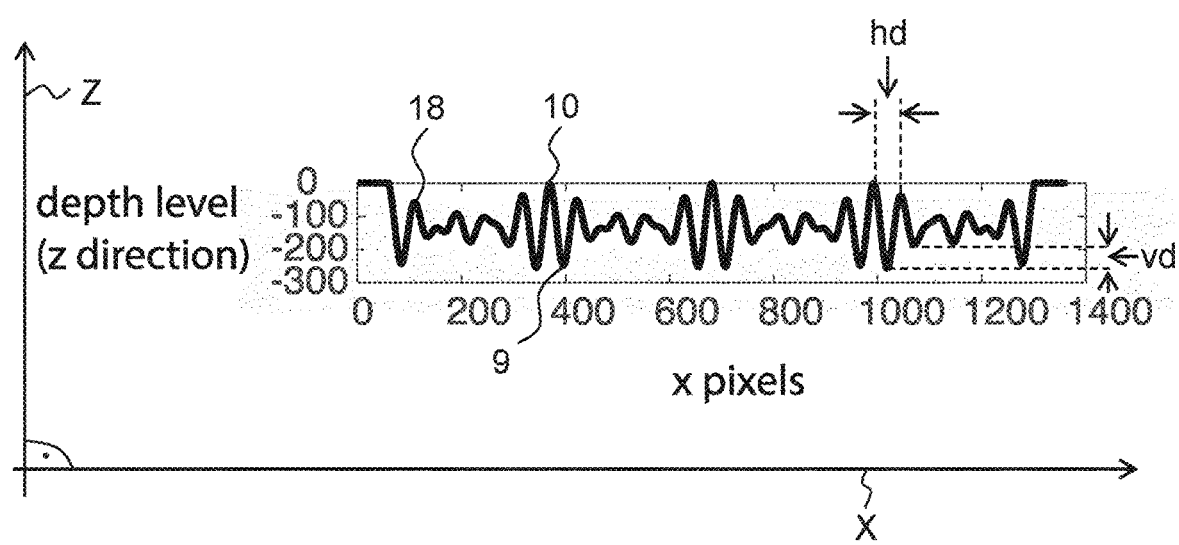

FIG. 11a depicts a grayscale bitmap 13 for a three-component sinusoidal model relief structure 18. The sinusoidal modulation is along the first direction x, and the model relief structure 18 is constant along the second direction y. The bitmap 13 is constructed using square pixels with a side length of 10 nm. The model relief structure 18 is divided into 256 depth levels (8-bit precision) along the third direction z, see FIG. 11b.

Figure 12A:
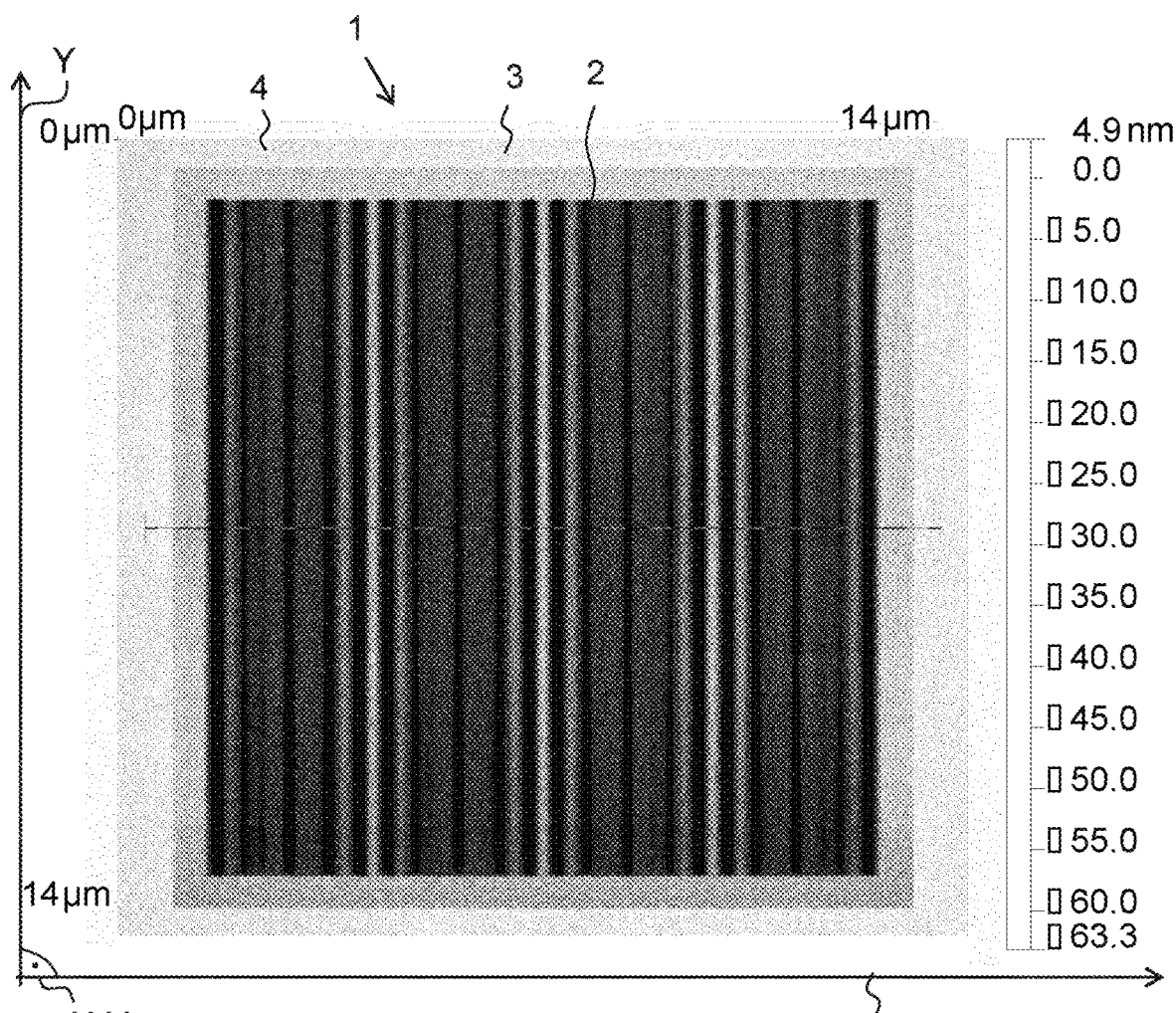
FIG. 12a shows a topography of a diffractive optical element comprising a relief structure in the shape of a three-component sinusoidal profile according to the invention.
Figure 12B:
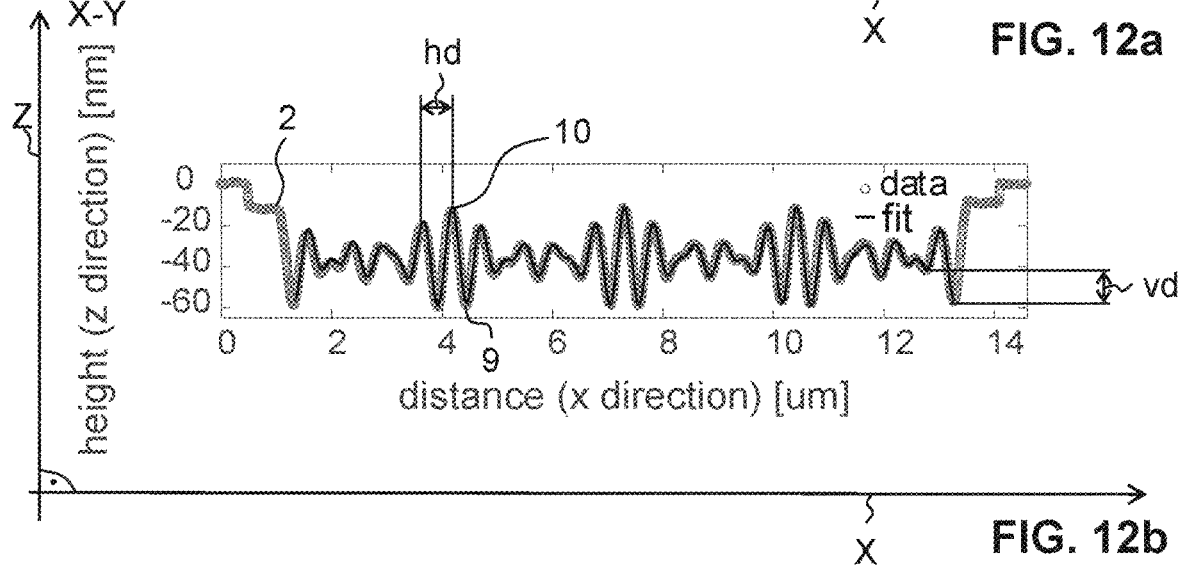

FIG. 12a depicts a topography of a three-component sinusoidal relief structure 2 in polymer resist 3. The topography is measured in situ by the thermal scanning probe 6 during the patterning process. The grayscale colour map indicates the height of the measured points, where the zero value is normalized to the flat surface 4 outside the patterned region 2. The cross-section depicted in FIG. 12b has been averaged over 1 micrometer (100 pixels). The black line is a fit of the desired relief structure, in this case a three-component sinusoid, which was used to generate the bitmap 13 and model relief structure 18. The fitted sinusoidal function is represented by the formula $f(x)=A_1 \sin(k_1x-\varphi_1)+A_2 \sin(k_2x-\varphi_2)+A_3 \sin(k_3x-\varphi_3)+\Delta$. The fit parameters return values of 10.5 nm, 10.1 micrometer$^{-1}$, and −3.0 radians for the parameters defining the amplitude, spatial frequency, and phase, respectively, of the first sinusoidal function. The fit parameters return values of 8.8 nm, 12.1 micrometer$^{-1}$, and −1.3 radians for the parameters defining the amplitude, spatial frequency, and phase, respectively, of the second sinusoidal function. The fit parameters return values of 7.6 nm, 14.1 micrometer$^{-1}$, and 0.95 radians for the parameters defining the amplitude, spatial frequency, and phase, respectively, of the third sinusoidal function. The fit parameters return a value of −34.9 nm for the offset parameter.

Figure 13A:
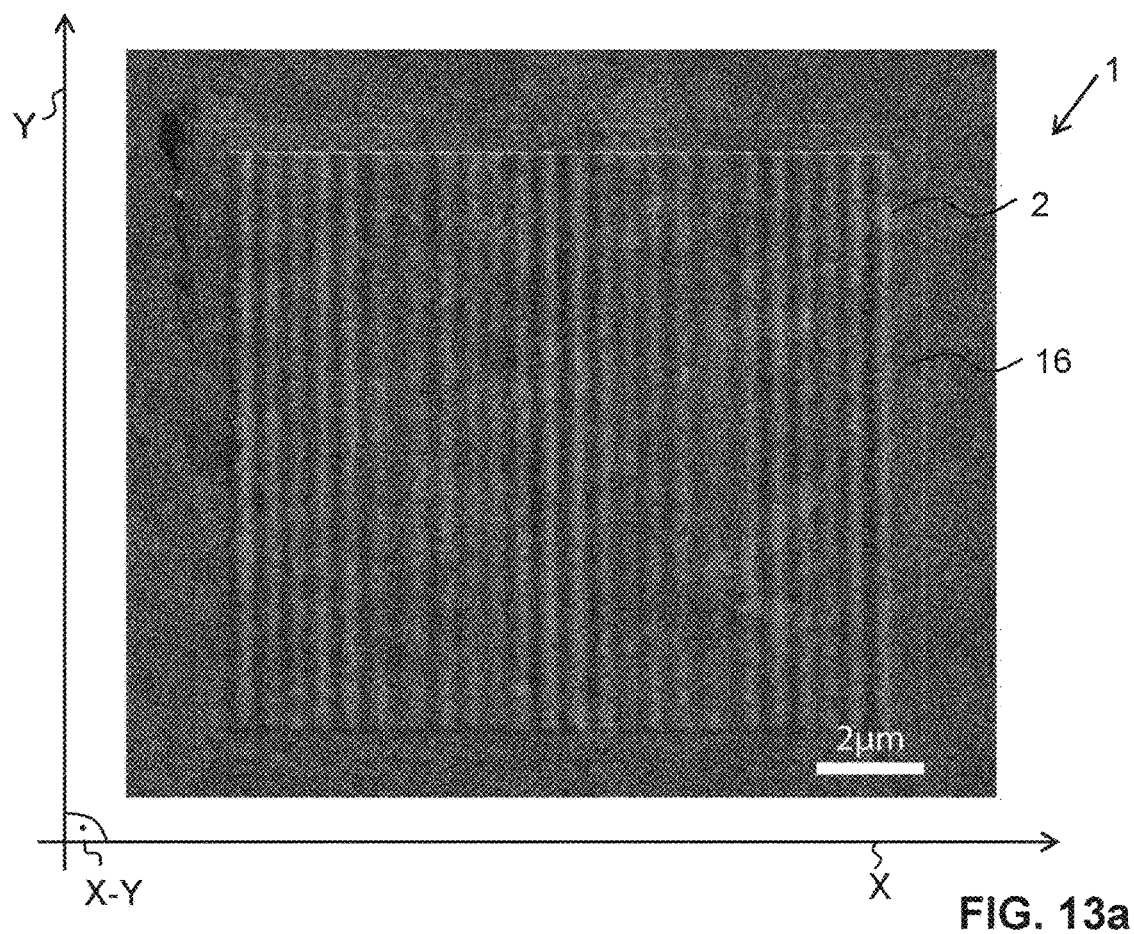
FIG. 13a shows a scanning electron micrograph of a diffractive optical element comprising a relief structure in the shape of a three-component sinusoidal profile according to the invention.
Figure 13B:
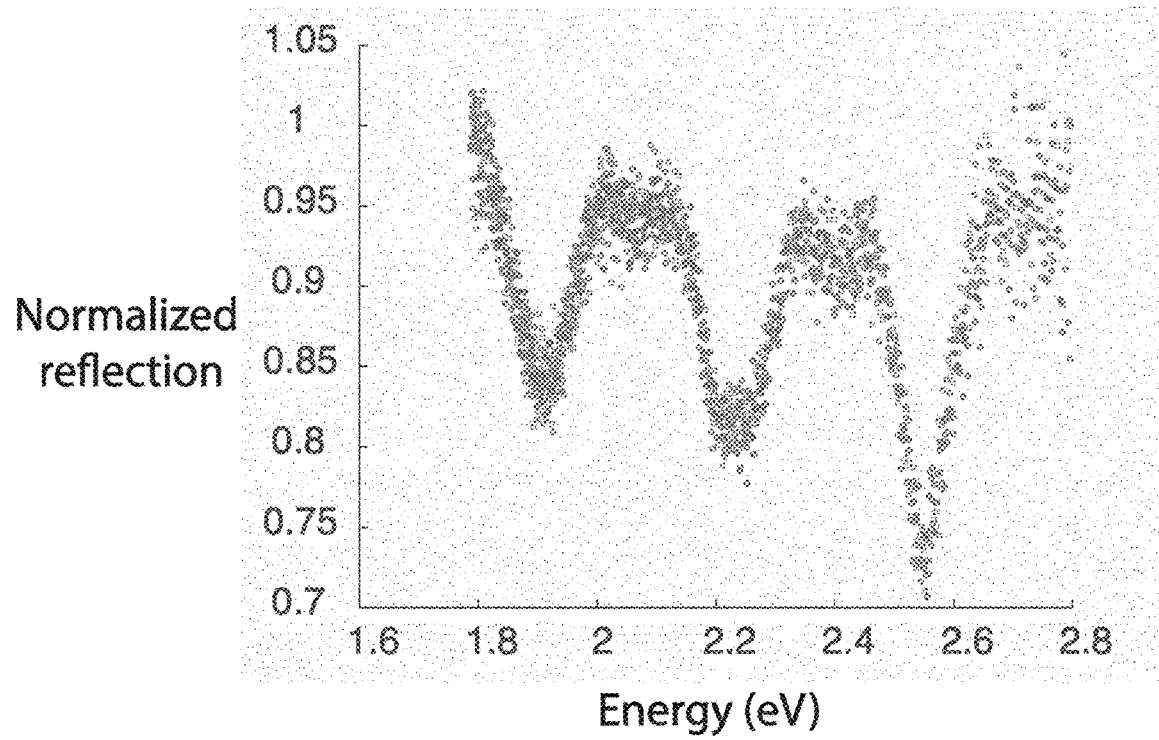
FIG. 13b shows a spectrally-resolved reflection measurement at normal incidence of the diffractive optical element according to FIGS. 11 and 12.

FIG. 13a depicts a scanning electron micrograph of a three-component sinusoidal relief structure 2 on a silver surface 16. The relief structure 2 was transferred to the silver surface 16 using template stripping, where a polymer surface 4 similar to the one depicted in FIG. 12a was used as the template. FIG. 13b corresponds to a spectrally-resolved reflection measurement at normal incidence of the three-component sinusoidal relief structure 2 on a silver surface 16 with a profile from FIGS. 11 and 12. The dip in reflectivity at photon energies of ~1.9 eV, ~2.2 eV, and ~2.6 eV shows that light with those particular wavelengths that is normally incident on the relief structure 2 is diffracted to modes that propagate along the silver surface 16.

Figure 14B:
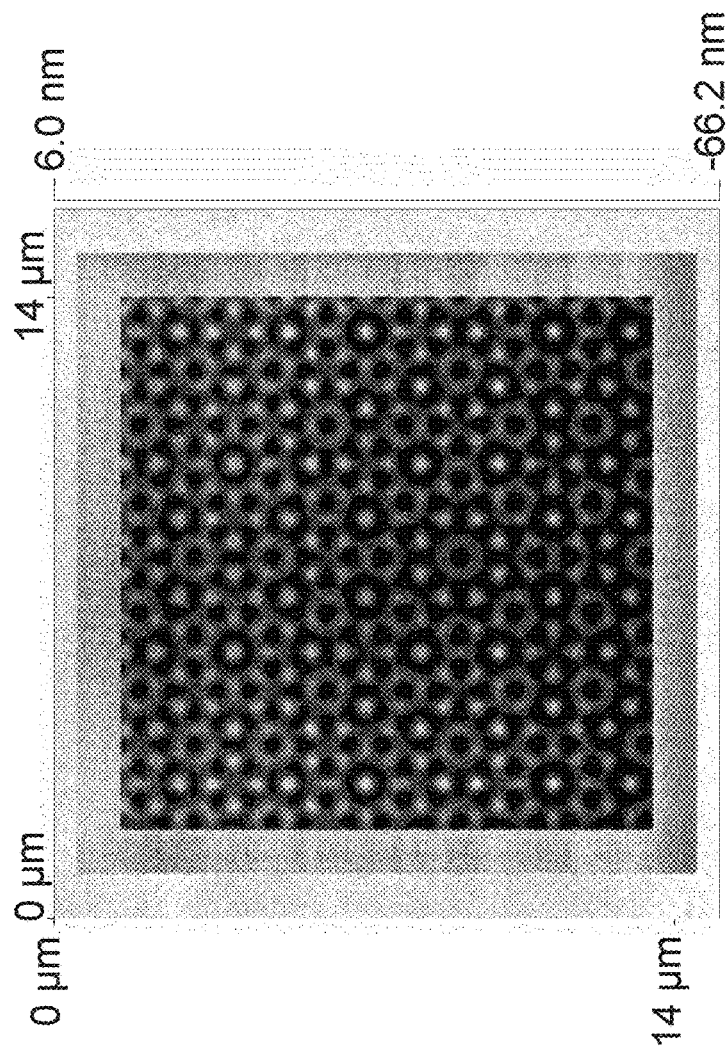
Figure 14A:
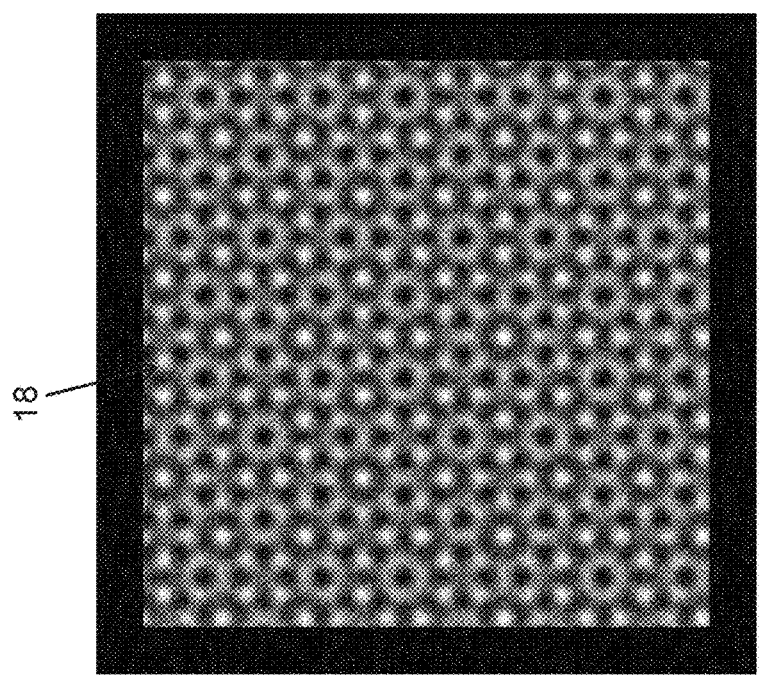
FIG. 14a shows a bitmap for a two-dimensional model relief structure.
Figures 14C, 14D:
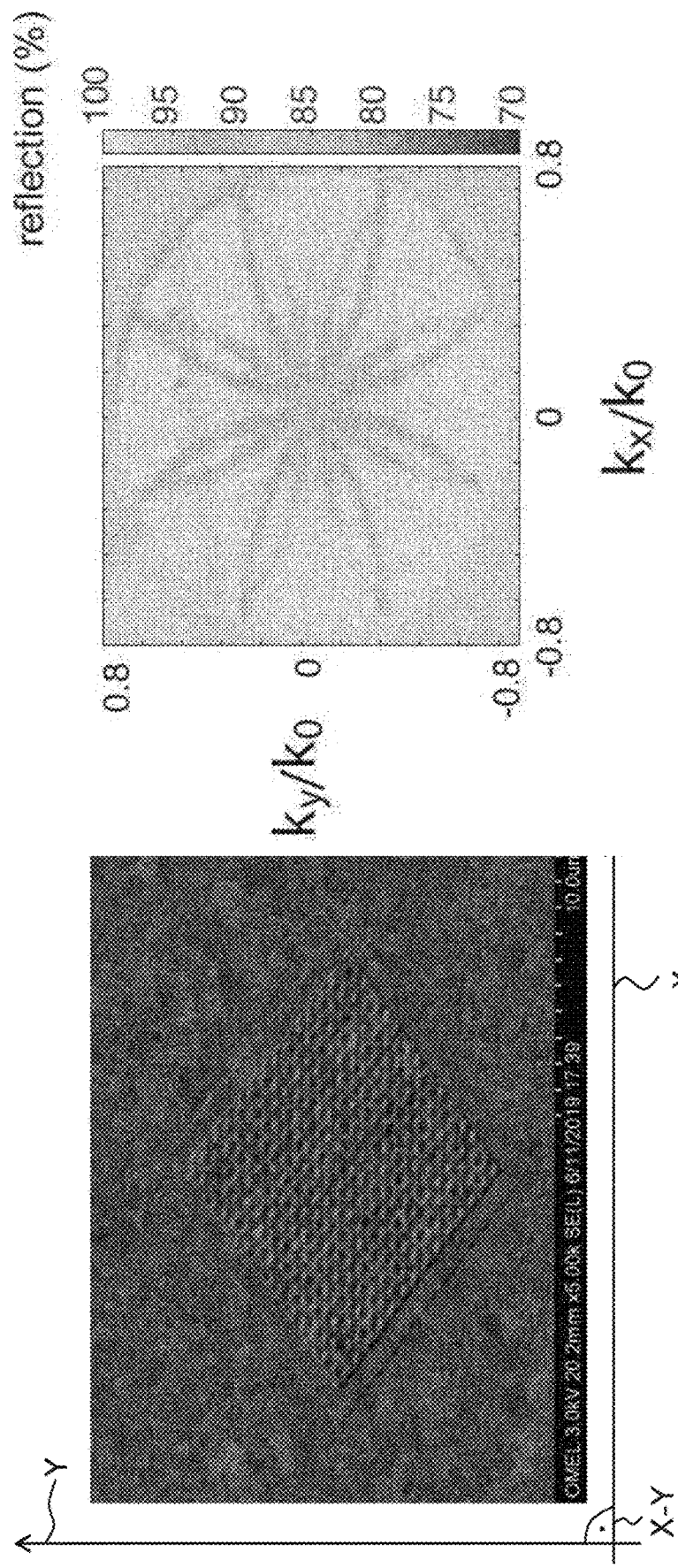
FIG. 14c shows a scanning electron micrograph of a diffractive optical element comprising a relief structure obtained from the bitmap and topography data according to FIGS. 14a and 14b.
FIG. 14d shows a k-space reflection measurement of the diffractive optical element according to FIG. 14c.

FIG. 14a depicts a bitmap 13 for two-dimensional grayscale model relief structure 18 (quasicrystal with 8-fold rotational symmetry). FIG. 14b depicts topography data for said two-dimensional grayscale pattern. FIG. 14c depicts a scanning electron micrograph of said two-dimensional grayscale relief structure 2. FIG. 14d corresponds to a k-space reflection measurement of the two-dimensional grayscale relief structure 2 showing 8-fold rotational symmetry.

Figure 15:
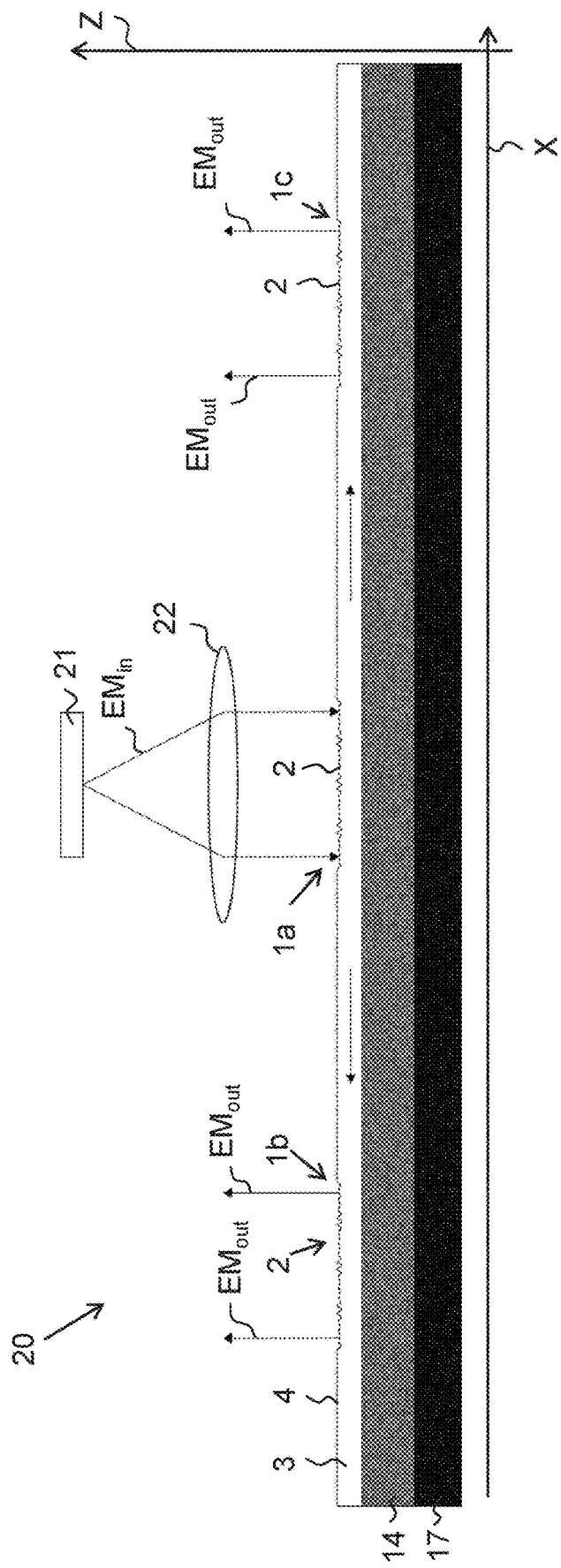
FIG. 15 shows a schematic illustration of a virtual image display device comprising diffractive optical elements according to the invention.
Figure 16:
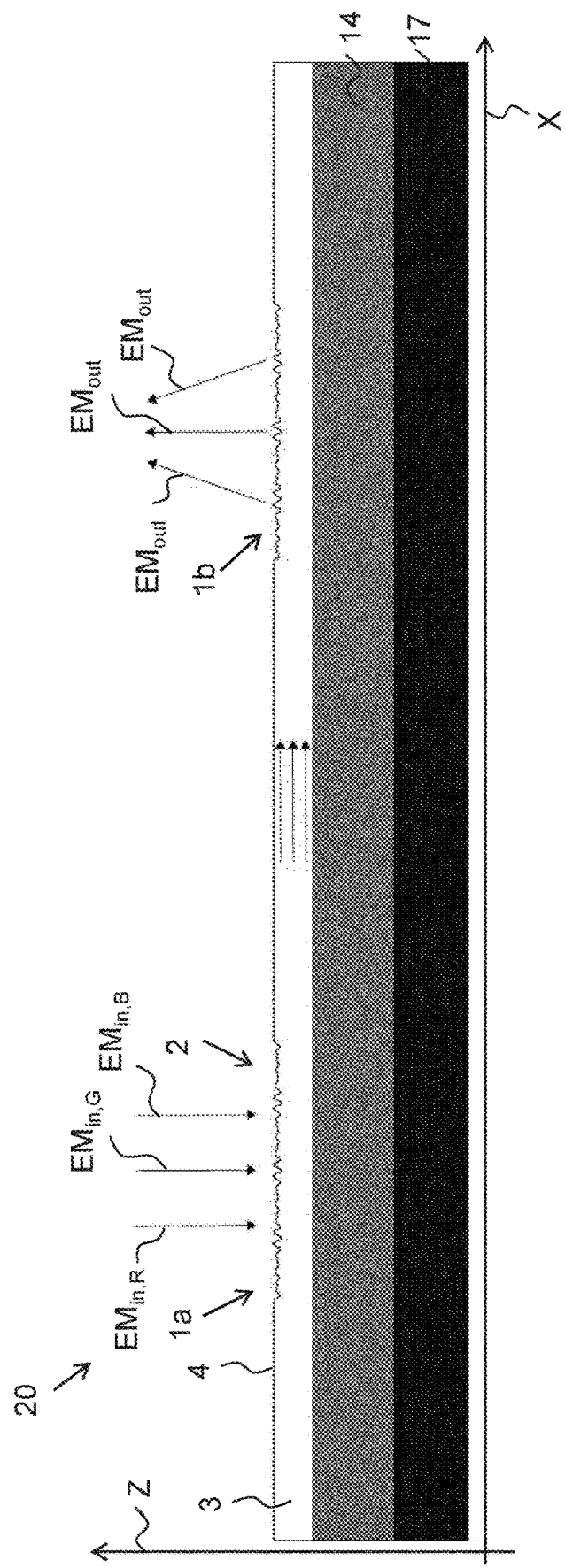
FIG. 16 shows a schematic illustration of another virtual image display device comprising diffractive optical elements according to the invention.

FIGS. 15 and 16 depict different embodiments of a virtual image display device 20 comprising diffractive optical elements 1 according to the invention. In particular, FIG. 15 depicts a virtual image display device 20 comprising a source of radiation in the form of an image display element 21, an optical system in the form of a lens 22, for example a collimating lens, a substrate 3 in the form of an optical waveguide, and three diffractive optical elements 1 according to the invention. The image display device 21 is configured to generate an image frame $EM_{in}$ which is collimated by means of the lens 22 onto the first diffractive optical element 1a being provided in a surface 4 of the optical waveguide 3. The first diffractive optical element 1a is configured such, that the incident image frames $EM_{in}$ are coupled into the optical waveguide 3 and can propagate along the optical waveguide 3. Due to the surface profile of the relief structure 2 of the first diffractive optical element 1a, the incident image frames $EM_{in}$ are diffracted such that they propagate along opposite directions within the optical waveguide 3. One of the propagating image frames is then coupled out of the optical waveguide 3 at the second diffractive optical element 1b and the other of the propagating image frames is coupled out of the optical waveguide 3 at the third diffractive optical element 1c. As follows from FIG. 15, the second and third diffractive optical elements 1b, 1c are configured such, that the out-coupled beams $EM_{out}$ propagate parallel to one another.

The virtual image display device 20 according to FIG. 16 comprises a first diffractive optical element 1a that is configured such, that incident electromagnetic radiation is coupled into the substrate 3 in the form of an optical waveguide. In the present example the relief structure 2 of said first diffractive optical element 1a is configured such, that three beams of electromagnetic radiation having different wavelengths are coupled into the optical waveguide. Here, said three beams corresponds to red, green and blue light $EM_{in,R}$, $EM_{in,G}$ and $EM_{in,B}$. The first diffractive optical element 1a is further configured such, that the three beams propagate parallel to one another and parallel to the surface 4 of the optical waveguide 3. When the propagating beams are incident on the second diffractive optical element 1b, said beams are coupled out of the second diffractive optical element. In the present example the second diffractive optical element 1b is configured such, that the out-coupled beams $EM_{out}$ interfere with one another, whereby an interference pattern is generated to form a specific light field. Said interference pattern can constitute a hologram, for example.

Here, the virtual image display devices 20 according to both figures comprise a substrate 3 in the form of an optical waveguide being made of a material having a high refractive index. Said optical waveguide is arranged on a further substrate 14 in the form of a middle layer which is in turn arranged on a bottom layer 17 as they have been described with reference to FIG. 7 above.

The diffractive optical elements 1 depicted in the figures were produced by using poly(methyl methacrylate-co-methacrylic acid) (PMMA/MA, 33% methacrylic acid, AR-P 617.03, Allresist) as the thermally sensitive polymer into which grayscale relief structures 2 were generated, i.e. patterned, using thermal scanning-probe lithography. As further substrates 2-inch silicon wafers were taken directly from factory packaging without any cleaning or additional preparation steps. An approximately 150 nm-thick film of PMMA/MA was spin-coated onto the silicon substrate using a two-step spin-coating process (Step 1: 5 seconds spin time, 500 rpm spin speed, 500 rpm/s acceleration. Step 2: 40 seconds spin time, 2000 rpm spin speed, 2000 rpm/s acceleration). After spin-coating, the substrate with a PMMA/MA layer was baked on a hot plate at 180° C. for 5 minutes.

The model relief structure, here grayscale model relief structures, were designed in MATLAB. Analytical sinusoidal functions were used to define the model relief structure. The model relief structure was then discretized into square pixels with 10 nm side length in the first and second directions x, y. The depth of the relief structure 2 along the third direction z was discretized to 256 depth levels, generating an 8-bit grayscale bitmap.

The grayscale relief structures 2 were fabricated in the PMMA/MA layer using a commercial thermal scanning-probe lithography tool 5 (NanoFrazor Explore, SwissLitho AG). The bitmap relief structure, i.e. the discretized controller data, was uploaded to the tool, where the 8-bit depth information was assigned to a physical patterning depth in the PMMA/MA layer. A silicon-based thermal scanning-probe cantilever 6 (provided by SwissLitho AG) was loaded into the tool 5. The tool 5 was calibrated in the first, second and third directions x, y, and z by writing simple patterns in the PMMA/MA layer, measuring the topography of these patterns in-situ, and adjusting the tip 7 temperature and writing force to minimize the error between the pattern design and the measured pattern depth. After calibration, the tool carried out the desired patterning functions.

After patterning, the PMMA/MA layer acted as a template for transferring the grayscale surface pattern or relief structure 2 to silver surfaces. The patterned polymer template was loaded into a thermal evaporator (Kurt J. Lesker Nano36) where it was pumped down to a vacuum level of approximately 1×10−7 Torr. Evaporation was performed with silver pellets (99.99%, Kurt J. Lesker) in a tungsten boat at a deposition rate of 25 Å/s to cover the template with high-quality optically thick silver films (>500 nm). After evaporation, UV-curable epoxy was deposited on the silver film, and a glass microscope slide was placed on top. The epoxy was cured for 2 hours under a UV lamp, after which the silver film was removed from the template such that the grayscale surface pattern 2 was formed on the smooth side of the silver film that was in contact with the template.

Optical measurements were performed using an inverted optical microscope (Nikon, Ti-U) with an air objective. The sample was illuminated with a broadband halogen lamp, and the reflected light was collected and imaged onto a complimentary-metal-oxide-semiconductor (CMOS) camera attached to a grating spectrometer. The illumination and reflected light were separated using a beamsplitter. A linear polarizer was placed in the collection path to filter out TE-polarized light.

| LIST OF REFERENCE SIGNS | |
|---|---|
| 1, 1a, 1b, 1c | diffractive optical element |
| 2 | relief structure |
| 3 | substrate |
| 4 | surface of substrate |
| 5 | processing device |
| 6 | probe |
| 7 | tip |
| 8 | surface of relief structure |
| 9 | recess |
| 10 | elevation |
| 11 | controller |
| 12 | computing device |
| 13 | bitmap |
| 14 | further substrate |
| 15 | surface of further substrate |
| 16 | film |
| 17 | further substrate |
| 18 | model relief structure |
| 19 | carrier |
| 20 | virtual image display device |
| 21 | image display element |
| 22 | optical system |
| x | first direction |
| y | second direction |
| z | third direction x-yhorizontal plane |
| D | distance |
| R | radius |
| hd | horizontal distance |
| vd | depth |
| $EM_{in}$ | incident electromagnetic radiation |
| $EM_{out}$ | outgoing electromagnetic radiation |

The invention claimed is:

1. A method of producing a diffractive optical element comprising the steps of:
providing at least one substrate having a surface extending in a first direction and a second direction running perpendicularly to the first direction; and
generating a relief structure in the surface of the substrate using a processing device;
wherein the processing device comprises a probe having a tip,
wherein the tip has a radius being smaller than about 1 micrometer or smaller than about 20 nanometer, and
wherein the probe is movable in the first direction, the second direction and a third direction running perpendicularly to the first direction and the second direction with respect to the substrate, and wherein the relief structure is generated by an action of the tip on the surface of the substrate such that a distance between a surface of the relief structure and the surface of the substrate along the third direction varies essentially continuously along at least one of the first direction and the second direction,
wherein the processing device further comprises a controller configured to control the probe based on controller data that is fed into the controller,
wherein the controller data defines the relief structure along a horizontal plane being spanned by the first direction and the second direction, and
wherein the controller data is based on two or more sinusoidal functions f(x,y),
wherein the two or more sinusoidal functions are represented by the expression:

$$f_n(x, y) = A_n \sin(k_n(x \cos \alpha_n - y \sin \alpha_n) + \varphi_n) + \Delta_n$$

wherein the parameter $A_n$ is the amplitude,
wherein the parameter $k_n$ is the spatial frequency,
wherein the parameter $\alpha_n$ is the angular direction along the horizontal plane,
wherein the parameter $\varphi_n$ is the phase, and
wherein the parameter $\Delta_n$ is an offset with respect to the third direction,
wherein the controller data is generated by the steps of:
(i) defining the relief structure to be generated in the horizontal plane with two or more sinusoidal functions $f_n(x,y)$ in a computing device, whereby a model relief structure is obtained; and
(ii) discretizing the model relief structure of step (i) into pixels in the computing device, whereby discretized controller data is obtained, and
wherein the probe is moved according to the controller data being fed to the controller of the processing device.

2. The method according to claim 1, wherein at least one of:
i) the relief structure is generated by at least one of a mechanical and thermal action of the tip on the surface of the substrate,
ii) the tip is in direct contact with the surface of the substrate upon the generation of the relief structure, or
iii) the processing device is a thermal scanning-probe lithography device.

3. The method according to claim 1, wherein at least one of:
i) the probe is moved at least one of in the first direction and in the second direction in steps of about 0.1 nanometer to 50 micrometer or in steps of about 0.1 nanometer to 100 nanometer or in steps of 5 nanometer to 50 nanometer or in steps of less than about 20 nanometer,
ii) the probe is moved in the third direction in steps of about 0.1 nanometer to 1 micrometer or in steps of 0.2 nanometer to 25 nanometer or in steps of less than about 2 nanometer, and/or
iii) the probe is moved at least one of in the first direction and the second direction with a rate of between about 1 hertz to 1'000 kilohertz or between about 1 kilohertz to 500 kilohertz.

4. The method according to claim 1, wherein said two or more sinusoidal functions $f_n(x,y)$ are summed up in a Fourier Series:

$$F(x, y) = \sum_n f_n(x, y).$$

5. The method according to claim 1, wherein at least one of a dielectric film or a metal film or a transition metal film is applied on the relief structure, whereby the relief structure is generated in the dielectric film or the metal film or the transition metal film,
  wherein a curable resin such as a UV-curable epoxy resin is deposited on the dielectric film or the metal film or the transition metal film,
  wherein a carrier is applied to the curable resin,
  wherein the curable resin is cured, and
  wherein a template stripping is performed such that the carrier, the cured resin and the dielectric film or the metal film or the transition metal film comprising a negative of the relief structure are removed from the substrate.

6. The method according to claim 5, wherein the carrier comprises a dielectric material, a metal, a transition metal, a semiconductor material, a polymerizable polymer, or a polymer.

7. The method according to claim 1, further comprising the step of providing a further substrate,
  wherein the further substrate has a surface extending in the first direction and the second direction,
  wherein the substrate is provided on the surface of the further substrate, and
  wherein the relief structure of the substrate is etched into the surface of the further substrate.

8. The method according to claim 1, wherein one or more relief structures are generated in the surface of the substrate and, if applicable, in the surface of the further substrate.

9. The method according to claim 8, wherein said one or more relief structures are arranged immediately adjacent to one another or spaced apart from one another with respect to at least one of the first direction and the second direction.

10. A diffractive optical element produced by a method according to claim 1.

11. The diffractive optical element according to claim 10,
  wherein at least a portion of the relief structure when seen along at least one of the first direction and the second direction comprises a plurality of elevations and recesses, wherein at least one of:
  i. a minimal horizontal distance between at least one of a) two successive elevations and b) two successive recesses along at least one of the first direction and the second direction is smaller than about 1 micrometer or smaller than about 20 nanometer or wherein the minimal horizontal distance is about 10 nanometer, and
  ii. a minimal depth that extends in the third direction and that is formed between at least one of a) two successive elevations and b) two successive recesses along at least one of the first direction and the second direction is smaller than about 100 nanometer or smaller than about 10 nanometer or wherein the minimal depth is about 0.2 nanometer,
  wherein a surface profile of the relief structure is defined as a sinusoid comprising two or more sinusoidal functions $f_n(x,y)$ being represented by the expression:

$$f_n(x, y) = A_n \sin(k_n(x\cos\alpha_n - y\sin\alpha_n) + \varphi_n) + \Delta_n$$

wherein the parameter $A_n$ is the amplitude,
  wherein the parameter $k_n$ is the spatial frequency,
  wherein the parameter $\alpha_n$ is the angular direction along the horizontal plane (x-y),
  wherein the parameter $\varphi_n$ is the phase, and
  wherein the parameter $\Delta_n$ is an offset with respect to the third direction (z).

12. The diffractive optical element according to claim 11, wherein at least the portion of the relief structure is configured such, that at least one beam of electromagnetic radiation having a given wavelength can be incident on the portion of the relief structure under at least one desired incoming angle and can be diffracted under at least one desired outgoing angle.

13. The diffractive optical element according to claim 11, wherein the relief structure is configured such, that the at least one beam of electromagnetic radiation is diffracted in a manner that the diffracted outgoing electromagnetic radiation interferes to form a specific light field.

14. The diffractive optical element according to claim 11, wherein at least the portion of the relief structure is configured such, that at least a first beam of electromagnetic radiation having a first wavelength and being incident on the portion of the relief structure under a first incoming angle is diffracted under a first outgoing angle and a second beam of electromagnetic radiation having a second wavelength differing from the first wavelength and being incident on the portion of the relief structure under a second incoming angle is diffracted under a second outgoing angle, wherein:
  i. the first incoming angle essentially equals the second incoming angle and the first outgoing angle essentially equals the second outgoing angle, or
  ii. the first incoming angle essentially equals the second incoming angle and the first outgoing angle differs from the second outgoing angle, or
  iii. the first incoming angle differs from the second incoming angle and the first outgoing angle essentially equals the second outgoing angle, or
  iv. the first incoming angle differs from the second incoming angle and the first outgoing angle differs from the second outgoing angle.

15. The diffractive optical element according to claim 10, wherein at least a portion of the relief structure is configured such, that at least one beam of electromagnetic radiation having a given wavelength can be incident on the portion of the relief structure under at least one desired incoming angle and can be diffracted under at least one desired outgoing angle.

16. The diffractive optical element according to claim 15, wherein the relief structure is configured such, that the at least one beam of electromagnetic radiation is diffracted in a manner that the diffracted outgoing electromagnetic radiation interferes to form a specific light field.

17. The diffractive optical element according to claim 10,
  wherein at least the portion of the relief structure is configured such, that at least a first beam of electromagnetic radiation having a first wavelength and being incident on the portion of the relief structure under a first incoming angle is diffracted under a first outgoing angle and a second beam of electromagnetic radiation having a second wavelength differing from the first wavelength and being incident on the portion of the relief structure under a second incoming angle is diffracted under a second outgoing angle, and
  wherein:
  i. the first incoming angle essentially equals the second incoming angle and the first outgoing angle essentially equals the second outgoing angle, or ii. the first incoming angle essentially equals the second incoming angle and the first outgoing angle differs from the second outgoing angle, or
iii. the first incoming angle differs from the second incoming angle and the first outgoing angle essentially equals the second outgoing angle, or
iv. the first incoming angle differs from the second incoming angle and the first outgoing angle differs from the second outgoing angle.

18. A virtual image display device comprising:

a source of radiation, a substrate, and at least a first and a second diffractive optical element as claimed in claim 10, wherein the source of radiation is configured to emit at least one beam of electromagnetic radiation;

wherein the first diffractive optical element is arranged on or in the substrate such, that the at least one beam of electromagnetic radiation being incident on the first diffractive optical element is coupled into the substrate and propagates along the substrate, and wherein the second diffractive optical element is arranged on or in the substrate such, that the propagating at least one beam of electromagnetic radiation is coupled out of the substrate.

19. The virtual image display device as claimed in claim 18, wherein the source of radiation is at least one of an image display element and is configured to emit at least one image frame.

20. A virtual image display device comprising:

a source of radiation, a substrate, and at least one diffractive optical element as claimed in claim 10, wherein the source of radiation is configured to emit at least one beam of electromagnetic radiation;

wherein the diffractive optical element is arranged on or in the substrate such, that the at least one beam of electromagnetic radiation being incident on the diffractive optical element is diffracted in a manner that the diffracted outgoing electromagnetic radiation interferes to form a specific light field.

21. The method according to claim 1, wherein the discretized controller data is stored in a digital file.

* * * * *